United States Patent
Min

(10) Patent No.: US 9,223,076 B2
(45) Date of Patent: Dec. 29, 2015

(54) SEMICONDUCTOR LIGHT EMITTING DEVICE PACKAGE

(71) Applicant: LG INNOTEK CO., LTD., Seoul (KR)

(72) Inventor: Bong Kul Min, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/231,674

(22) Filed: Mar. 31, 2014

(65) Prior Publication Data

US 2014/0211500 A1 Jul. 31, 2014

Related U.S. Application Data

(63) Continuation of application No. 13/156,486, filed on Jun. 9, 2011, now Pat. No. 8,684,580.

(30) Foreign Application Priority Data

Apr. 14, 2011 (KR) .......................... 10-2011-0034720

(51) Int. Cl.
*H01L 33/60* (2010.01)
*F21V 8/00* (2006.01)
(Continued)

(52) U.S. Cl.
CPC .............. *G02B 6/0035* (2013.01); *G02B 6/005* (2013.01); *G02B 6/0073* (2013.01); *H01L 25/0753* (2013.01); *H01L 33/60* (2013.01); *F21K 9/13* (2013.01); *F21V 29/83* (2015.01); *F21Y 2101/02* (2013.01); *H01L 25/167* (2013.01); *H01L 33/486* (2013.01); *H01L 2224/48137* (2013.01);
(Continued)

(58) Field of Classification Search
CPC ... H01L 25/0753; H01L 33/60; H01L 33/486; H01L 2224/48465; H01L 2224/48247; H01L 2224/48137; H01L 2224/49113; H01L 2224/19107; H01L 25/167; H01L 2924/00; H01L 2924/3025; G02B 6/005; G02B 6/0035; G02B 6/0073; F21V 29/83; F21K 9/13; F21Y 2101/02

See application file for complete search history.

(56) References Cited

U.S. PATENT DOCUMENTS 3,820,237 A 6/1974 Effer
3,875,456 A 4/1975 Kano et al.
(Continued)

FOREIGN PATENT DOCUMENTS

DE 31 29 966 2/1983
DE 31 48 843 6/1983
(Continued)

OTHER PUBLICATIONS

U.S. Office Action issued in US. Appl. No. 13/156,486 dated Jan. 26, 2013.
(Continued)

*Primary Examiner* — Thomas M Sember
(74) *Attorney, Agent, or Firm* — Ked & Associates LLP

(57) ABSTRACT

A semiconductor light emitting device package is provided, including a body, first and second reflective cups disposed under a top surface of the body and spaced apart, a first connection pad disposed under the top surface of the body and spaced apart from the first and second reflective cups, a second connection pad disposed under the top surface of the body and spaced apart from the first and second reflective cups and the first connection pad, a first semiconductor light emitting device disposed within the first reflective cup, and a second semiconductor light emitting device disposed within the second reflective cup.

20 Claims, 21 Drawing Sheets

(51) Int. Cl.
*H01L 25/075* (2006.01)
*H01L 25/16* (2006.01)
*F21K 99/00* (2010.01)
*H01L 33/48* (2010.01)
*F21Y 101/02* (2006.01)
*F21V 29/83* (2015.01)

(52) U.S. Cl.
CPC ............... *H01L2224/48247* (2013.01); *H01L 2224/48465* (2013.01); *H01L 2224/49113* (2013.01); *H01L 2924/19107* (2013.01); *H01L 2924/3025* (2013.01)

(56) References Cited

U.S. PATENT DOCUMENTS

| | | | |
|---|---|---|---|
| 3,914,786 | A | 10/1975 | Grossi |
| 4,255,688 | A | 3/1981 | Nagasawa |
| 5,107,326 | A | 4/1992 | Hargasser |
| 5,298,768 | A | 3/1994 | Okazaki et al. |
| 6,459,130 | B1 | 10/2002 | Arndt et al. |
| 6,531,328 | B1 | 3/2003 | Chen |
| 7,345,318 | B2 | 3/2008 | Okuwaki et al. |
| 7,411,225 | B2 | 8/2008 | Kim et al. |
| 8,269,246 | B2 | 9/2012 | Min |
| 8,684,580 | B2 | 4/2014 | Min |
| 8,791,486 | B2 | 7/2014 | Min |
| 2006/0012992 | A1 | 1/2006 | Lee |
| 2006/0083281 | A1 | 4/2006 | Inoguchi |
| 2008/0012033 | A1 | 1/2008 | Arndt |
| 2009/0108282 | A1 | 4/2009 | Matsuda et al. |
| 2010/0078661 | A1 | 4/2010 | Shi et al. |

FOREIGN PATENT DOCUMENTS

| | | |
|---|---|---|
| DE | 42 32 637 | 3/1994 |
| DE | 42 32 644 | 3/1994 |
| EP | 0 400 176 | 12/1990 |
| EP | 0 521 312 | 1/1993 |
| EP | 1 467 414 | 10/2004 |
| JP | 60-261181 | 12/1985 |
| JP | H2-8070 | 1/1990 |
| JP | 06-077604 | 3/1994 |
| JP | 06-085328 | 3/1994 |
| JP | 06-104356 | 4/1994 |
| JP | 06-196759 | 7/1994 |
| JP | 7-202271 | 8/1995 |
| JP | 07-235696 | 9/1995 |
| JP | 3227295 | 8/2001 |
| JP | 2002-314138 | 10/2002 |
| JP | 2006-093435 | 4/2006 |
| JP | 2006-114854 A | 4/2006 |
| JP | 2008-098218 | 4/2008 |
| JP | 2008-112966 | 5/2008 |
| JP | 2010-003788 | 1/2010 |
| JP | 2010-010474 | 1/2010 |
| JP | 2010-45105 | 2/2010 |
| JP | 2010-118629 A | 5/2010 |
| KR | 10-2005-0012372 | 2/2005 |
| KR | 10-2006-0091480 | 8/2006 |
| KR | 10-0818162 B1 | 3/2008 |
| KR | 10-2008-0061561 A | 7/2008 |
| KR | 10-0855356 | 8/2008 |
| KR | 10-2008-0085505 | 9/2008 |
| KR | 10-2008-0094177 A | 10/2008 |
| KR | 10-0870950 | 11/2008 |
| KR | 10-0870950 B1 | 11/2008 |
| KR | 10-2009-0003378 A | 1/2009 |
| KR | 10-2009-0032866 | 4/2009 |
| KR | 10-2009-0100967 A | 9/2009 |
| KR | 10-2009-0132920 A | 12/2009 |
| KR | 10-2010-0114368 | 10/2010 |

OTHER PUBLICATIONS

U.S. Notice of Allowance issued in U.S. Appl. No. 13/156,486 dated Nov. 8, 2013.
U.S. Office Action issued in U.S. Appl. No. 13/133,327 dated Nov. 1, 2011.
U.S. Office Action issued in U.S. Appl. No. 13/113,327 dated Apr. 10, 2012.
U.S. Office Action issued in U.S. Appl. No. 13/604,706 dated May 23, 2013.
U.S. Office Action issued in U.S. Appl. No. 13/604,706 dated Aug. 23, 2013.
European Search Report dated Sep. 4, 2014, issued in Application No. 11168236.5.
Japanese Office Action dated Mar. 13, 2015.

SEMICONDUCTOR LIGHT EMITTING DEVICE PACKAGE

CROSS-REFERENCE TO RELATED APPLICATION(S)

This application is a Continuation of application Ser. No. 13/156,486 filed on Jun. 9, 2011, which claims priority under 35 U.S.C. §119 to Korean Application No. 10-2011-0034720 filed on Apr. 14, 2011, whose entire disclosures are hereby incorporated by reference.

TECHNICAL FIELD

The present invention relates to a semiconductor light emitting device package.

BACKGROUND

A light emitting device, for example, a light emitting diode, is a semiconductor device which converts electrical energy into light, and is receiving attention as a next-generation light source to replace conventional fluorescent lamps and incandescent lamps.

The light emitting diode generates light using a semiconductor device, thus causing very low power consumption as compared with an incandescent lamp generating light by heating tungsten or a fluorescent lamp generating light by irradiating ultraviolet light generated through high intensity discharge upon phosphors.

Further, the light emitting diode generates light using a potential gap of the semiconductor device, thus having a long lifespan and fast response time and being environmentally friendly as compared with conventional light sources.

Accordingly, considerable research efforts have focused upon developing light emitting diodes that can replace conventional light sources and light emitting diodes are increasingly used as light sources of lighting apparatuses, such as various lamps used indoors and outdoors, liquid crystal display devices, electric display boards, streetlights and so on.

SUMMARY

One embodiment is a semiconductor light emitting device package capable of achieving an enhancement in the degree of freedom of wiring while preventing a semiconductor light emitting device from being bonded to a reflective cup in a twisted state.

The semiconductor light emitting device package includes a body, first and second reflective cups disposed under a top surface of the body while being spaced apart from each other, a first connection pad disposed under the top surface of the body while being spaced apart from the first and second reflective cups, a second connection pad disposed under the top surface of the body while being spaced apart from the first and second reflective cups and the first connection pad, a first semiconductor light emitting device disposed in the first reflective cup, and a second semiconductor light emitting device disposed in the second reflective cup.

The first and second reflective cups may be depressed from the top surface of the body.

The first and second connection pads may be symmetrically disposed.

The first and second connection pads may be made of a material different from a material of the body.

The first and second connection pads may have the same shape and the same size.

One of the first and second connection pads may electrically connect the first and second light emitting devices.

The body may be made of one of polyphthalamide (PPA), silicon (Si), photo-sensitive glass (PSG), sapphire (Al2O3), and a printed circuit board (PCB), and the first and second connection pads are made of a metal material.

Each of the first and second connection pads may have a top surface flush with the top surface of the body.

A distance between the first reflective cup and the first connection pad may be equal to a distance between the first reflective cup and the second connection pad.

The distance between the first reflective cup and the first connection pad may be equal to a distance between the second reflective cup and the first connection pad.

Each of the first and second connection pads may have a diameter of 0.15 mm or more.

The body may include a cavity having side surfaces and a bottom. The first and second reflective cups may be disposed in a bottom of the body while being spaced apart from each other, and the first and second connection pads are disposed in the bottom of the body while being spaced apart from each other.

The first connection pad may have a center aligned with a center of the second connection pad.

Each of the first and second connection pads may include an upper portion exposed from the top surface of the body, and a lead frame connected to the upper portion while extending through a side wall of the body so as to be exposed to an outside of the body.

The lead frame may include a bent portion bent from the upper portion toward a bottom surface of the body, and a horizontal portion connected to the bent portion while extending in parallel to the upper portion. A part of the horizontal portion may be exposed from the side wall of the body and the bottom surface of the body.

The upper portion may have a thickness of 200 to 300 µm, and the lead frame may have a thickness of 0.2 to 0.3 mm.

The first semiconductor light emitting device may include first and second electrodes having different polarities, and the second semiconductor light emitting device may include third and fourth electrodes having different polarities.

The semiconductor light emitting device may further include a first wire for connecting the first electrode and the first reflective cup, a second wire for connecting the second electrode and the first connection pad, a third wire for connecting the first connection pad and the third electrode, and a fourth wire for connecting the fourth electrode and the second reflective cup.

The semiconductor light emitting device package may further include a first wire for connecting the first electrode and the first reflective cup, a second wire for connecting the second electrode and the second reflective cup, a third wire for connecting the first reflective cup and the third electrode, and a fourth wire for connecting the fourth electrode and the second reflective cup.

The semiconductor light emitting device package may further include a first wire for connecting the first electrode and the first reflective cup, a second wire for connecting the second electrode and the third electrode, and a third wire for connecting the fourth electrode and the second reflective cup.

The semiconductor light emitting device package may further include an encapsulation material for covering the top surface of the body while filling the first and second reflective cups.

Another embodiment is a backlight unit. The backlight unit comprises a bottom cover, a reflective plate provided on the bottom cover, a light guide plate disposed in front of the reflective plate, a light source modules emitting light to the light guide plate, wherein the light source modules includes a substrate and semiconductor light emitting device packages, and an optical sheet provided in front of the light guide plate. Each of the semiconductor light emitting device packages may be equal to the above embodiment.

Another embodiment is a display apparatus. The display apparatus comprises a display penal, a backlight unit emitting light to the display panel, and an image signal output circuit connected with the display panel to supply an image signal. The backlight unit may be equal to the above embodiment.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE INVENTION

Figure 1:
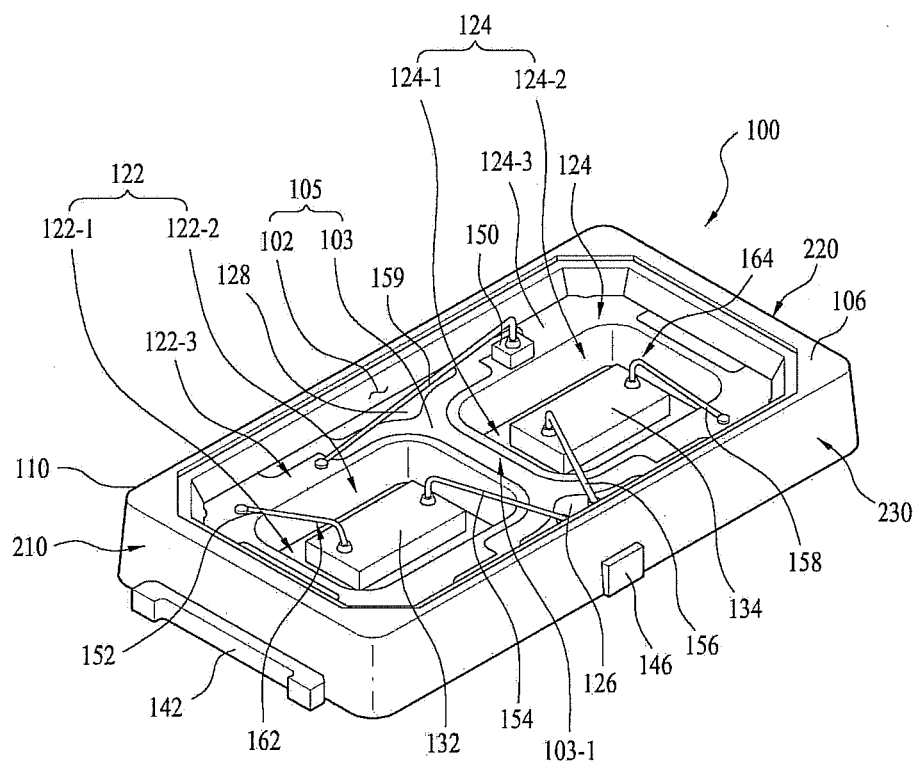
FIG. 1 is a perspective view of a semiconductor light emitting device package in accordance with an exemplary embodiment of the present invention.

Reference will now be made in detail to the preferred embodiments of the present invention, examples of which are illustrated in the accompanying drawings. In the following description of the embodiments, it will be understood that, when an element such as a layer (film), region, pattern, or structure is referred to as being "on" or "under" another element, it can be "directly" on or under another element or can be "indirectly" formed such that an intervening element may also be present. Also, terms such as "on" or "under" should be understood on the basis of the drawings.

In the drawings, dimensions of layers are exaggerated, omitted or schematically illustrated for clarity and description convenience. In addition, dimensions of constituent elements do not entirely reflect actual dimensions thereof. Wherever possible, the same reference numbers will be used throughout the drawings to refer to the same or like parts. Hereinafter, a semiconductor light emitting device package according to an exemplary embodiment of the present invention will be described with reference to the accompanying drawings.

Figure 2:
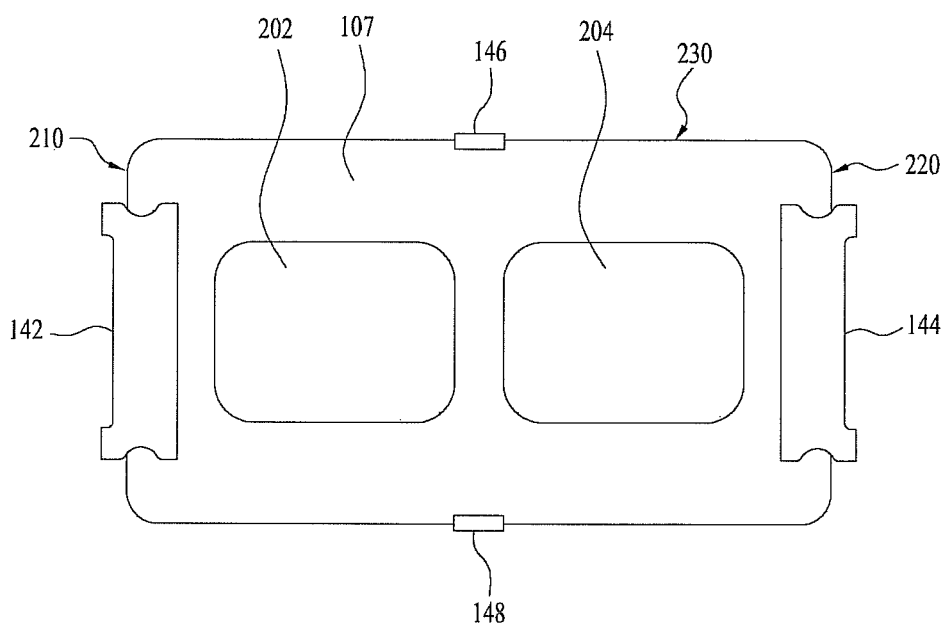
FIG. 2 is a bottom view of the semiconductor light emitting device package shown in FIG. 1.
Figure 3:
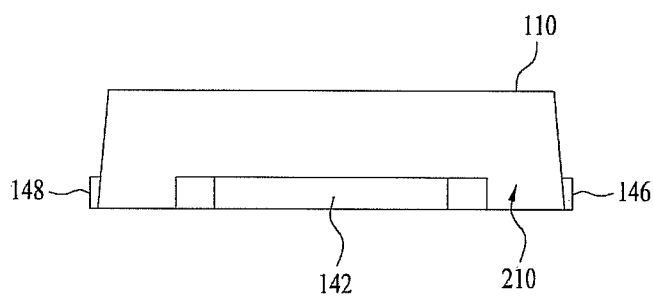
FIG. 3 is a first side view of the semiconductor light emitting device package shown in FIG. 1.
Figure 4:
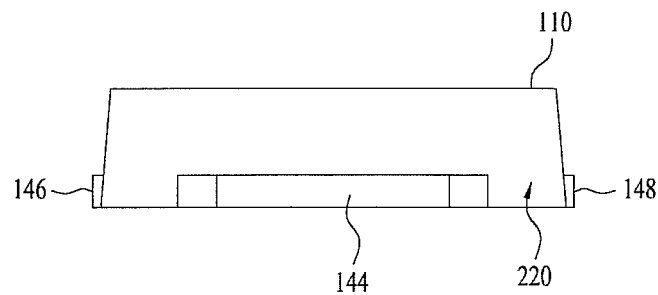
FIG. 4 is a second side view of the semiconductor light emitting device package shown in FIG. 1.
Figure 5:
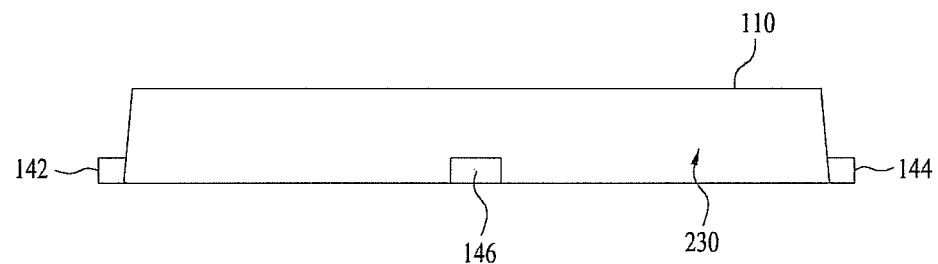
FIG. 5 is a third side view of the semiconductor light emitting device package shown in FIG. 1.
Figure 6:
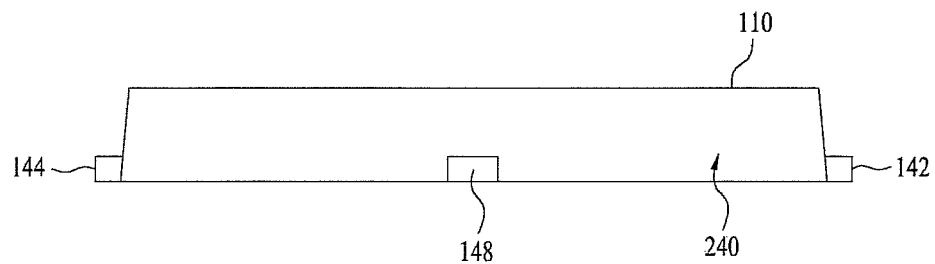
FIG. 6 is a fourth side view of the semiconductor light emitting device package shown in FIG. 1.

FIG. 1 is a perspective view of a semiconductor light emitting device package 100 in accordance with an exemplary embodiment of the present invention. FIG. 2 is a bottom view of the semiconductor light emitting device package shown in FIG. 1. FIG. 3 is a first side view of the semiconductor light emitting device package shown in FIG. 1. FIG. 4 is a second side view of the semiconductor light emitting device package shown in FIG. 1. FIG. 5 is a third side view of the semiconductor light emitting device package shown in FIG. 1. FIG. 6 is a fourth side view of the semiconductor light emitting device package shown in FIG. 1.

Referring to FIGS. 1 to 6, the semiconductor light emitting device package 100 includes a body 110, a first reflective cup 122, a second reflective cup 124, a first connection pad 126, a second connection pad 128, a first semiconductor light emitting device 132, a second semiconductor light emitting device 134, a zener diode 150, and wires 151 to 159.

The body 110 may be made of at least one selected from among a resin such as polyphthalamide (PPA), silicon (Si), a metal, photo-sensitive glass (PSG), sapphire (Al2O3), and a printed circuit board (PCB).

The body 110 may be made of a conductor. If the body 110 is made of a conductive material, an insulating film (not shown) may be formed on the surface of the body 110 so as to prevent electrical shorting of the body 110 with the first reflective cup 122, second reflective cup 124, first connection pad 126, or second connection pad 128.

An upper portion 106 of the body 110, as seen from the top, may have various shapes, such as a triangle, a rectangle, a polygon and a circle, according to purposes and designs of the semiconductor light emitting device package 100.

For example, the semiconductor light emitting device package 100, as shown in FIG. 1, may be used in an edge-type backlight unit (BLU). If the semiconductor light emitting device package 100 is applied to a portable flashlight or a home lighting apparatus, the body 110 may be modified so as to have a size and a shape easily allowing easy installation in the portable flashlight or the home lighting apparatus.

The body 110 includes a top surface 103 and reflective sidewalls 102. The reflective sidewalls 102 are formed to extend upward from the top surface 103. The body 110 has a cavity 105 (hereinafter, referred to as a "body cavity"), which is upwardly opened and includes side surfaces 102 and a bottom 103. The side surfaces 102 of the cavity 105 can correspond to the reflective sidewalls of the body 110, and the bottom 103 of the cavity 105 can correspond to the top surfaces of the body 110. The body cavity 105 may have a cup shape or a concave container shape. The side surfaces 102 of the body cavity 105 may be perpendicular or tilted with respect to the bottom 103.

Figure 7:
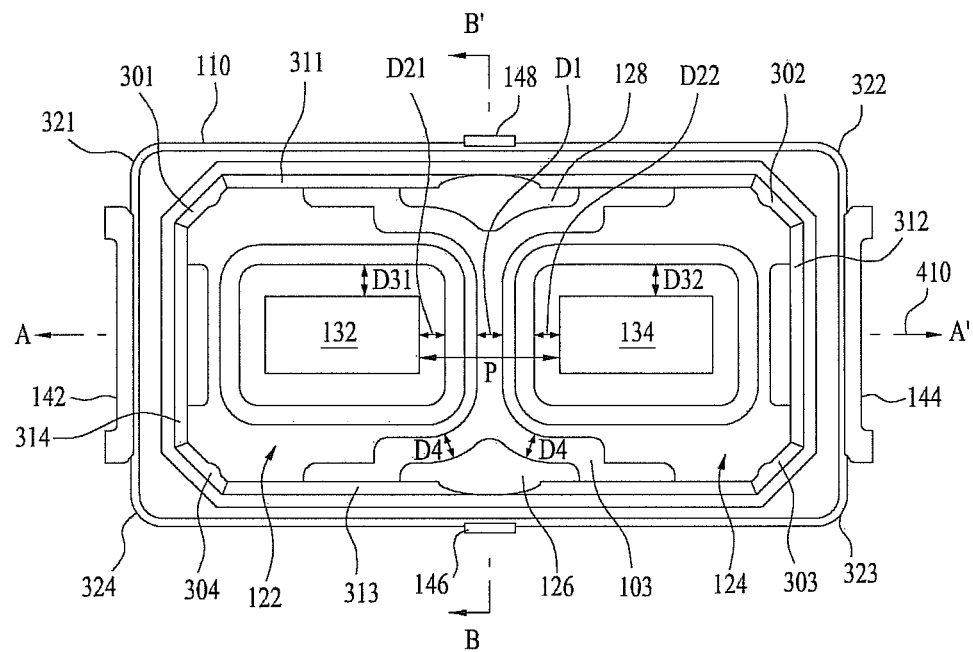
FIG. 7 is a plan view of the semiconductor light emitting device package shown in FIG. 1.

The shape of the body cavity 105, as seen from the top, may be a circle, an oval, or a polygon (for example, a rectangle). The corners of the body cavity 105 may be curved. As shown in FIG. 7, the shape of the body cavity 105, as seen from the top, may be approximately octagonal, and the side surfaces 102 of the body cavity 105 may include eight facets including first facets and second facets. The first facets may have a smaller area than the second facets. Here, the first facets may correspond to the side surfaces 102 of the body cavity 105 facing the respective corners of the body 110, and the second facets may correspond to the side surfaces 102 of the body cavity 105 each arranged between adjacent ones of the first facets.

The facing ones of the first facets 301 to 304 and second facets 311 to 314 may have the same shape and area. Some of the facing facets may have a curved structure. In accordance with another embodiment, the side surfaces 102 of the body cavity 105 may include facets, the number of which is less or more than 8. In this case, some of the facing facets may have a curved structure.

The first reflective cup 122 and the second reflective cup 124 may be disposed in the body 110 under the top of the body 110 while being spaced apart from each other. For example, the first and second reflective cup 122 and 124 may be disposed in the body 110 under the bottom 103 of the body cavity 105 such that the first and second reflective cups 122 and 124 are spaced apart from each other. The first reflective cup 122 may have a structure depressed from the bottom 103 of the body cavity 105 while being upwardly opened.

The first reflective cup 122 may have a cup structure including a first bottom 122-1, a first top surface 122-3, and first side surfaces 122-2 disposed between the first bottom 122-1 and the first top surface 122-3. The second reflective cup 124 may have a cup structure including a second bottom 124-1, a second top surface 124-3, and second side surfaces 124-2 disposed between the second bottom 124-1 and the second top surface 124-3.

The bottom 103 of the body cavity 105 may have a first cavity 162, which is upwardly opened and includes side surfaces and a bottom. The first reflective cup 122 may define the first cavity 162.

The second reflective cup 124 may have an upwardly-opened structure depressed from the bottom 103 of the body cavity 105 while being spaced apart from the first cavity 162. For example, the bottom 103 of the body cavity 105 may have a second cavity 164, which is upwardly opened and includes side surfaces and a bottom. The second reflective cup 124 may define the second cavity 164 while being spaced apart from the first cavity 162.

A portion 103-1 of the bottom 103 of the body cavity 105 may be disposed between the first reflective cup 122 and the second reflective cup 124. By the portion 103-1 of the bottom 103, the first reflective cup 122 and the second reflective cup 124 may be spaced apart from each other and isolated from each other.

The first cavity 162 and the second cavity 164, as seen from the top, may have a cup shape, a concave container shape, or the like. The side surfaces of the first and second cavities 162 and 164 may be perpendicular or tilted with respect to the associated bottoms of the first and second cavities 162 and 164.

At least a portion of each of the first and second reflective cups 122 and 124 may extend through the body 110 and be exposed to the outside of the body 110. Since at least a portion of each of the first and second reflective cups 122 and 124 is exposed to the outside of the body 110, it may be possible to enhance the efficiency of emitting, to the outside of the body 110, heat generated by the first and second light emitting devices 132 and 134.

Figure 17:
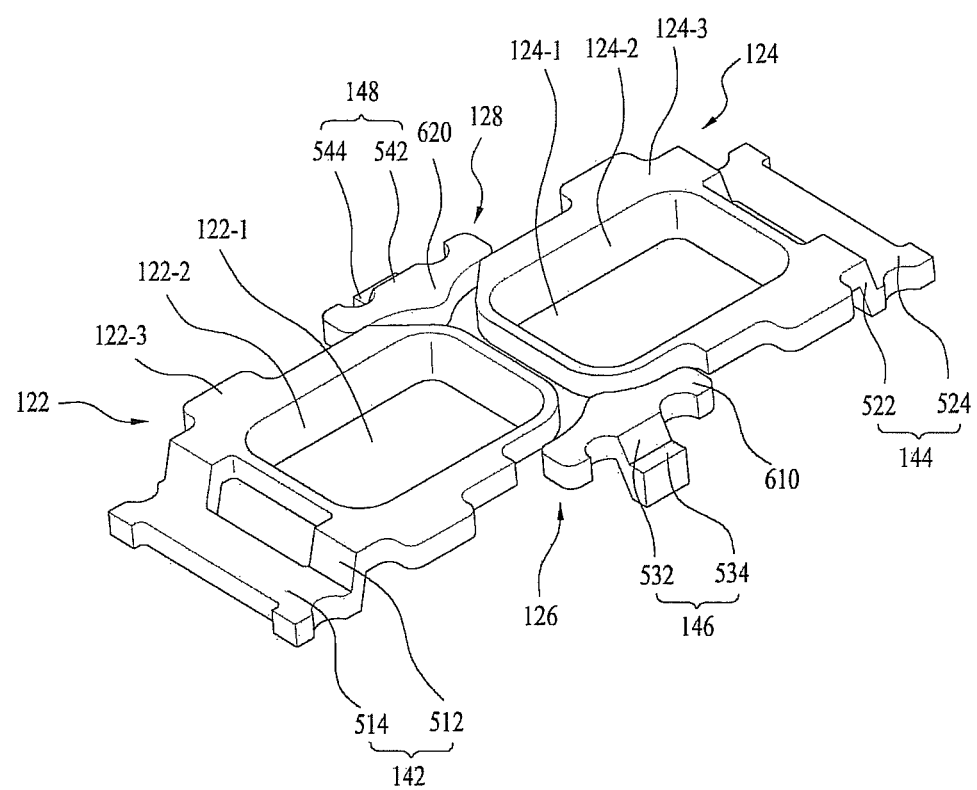
FIG. 17 is a perspective view illustrating first and second reflective cups and first and second connection pads shown in FIG. 1.

FIG. 17 illustrates the first reflective cup 122, second reflective cup 124, first connection pad 126, and second connection pad 128 shown in FIG. 1.

Referring to FIGS. 1 and 17, the first reflective cup 122 has an end 142 extending through a first side wall 210 of the body 110 to be exposed to the outside of the body 110. Hereinafter, the end 142 of the first reflective cup 122 will be referred to as a "first lead frame".

The first lead frame 142 is connected to the top surface 122-3 of the first reflective cup 122. The first lead frame 142 includes a first bent portion 512 and a first horizontal portion 514. The first bent portion 512 may be bent from the top surface 122-3 of the first reflective cup 122 toward a back 107 of the body 110. The angle formed between the first bent portion 512 and the top surface 122-3 of the first reflective cup 122 may be an acute angle.

The first bent portion 512 may have at least one first hole 501. A portion of the body 110 may fill the first hole 501. The first horizontal portion 514 may be connected to the first bent portion 512. The first horizontal portion 514 may extend in parallel with the bottom of the first reflective cup 122. A part of the first horizontal portion 514 may be exposed from the first side wall 210 and the back 107 of the body 110.

The second reflective cup 124 has an end 144 extending through a second side wall 220 of the body 110 to be exposed to the outside of the body 110. Hereinafter, the end 144 of the second reflective cup 124 will be referred to as a "second lead frame".

The second lead frame 144 is connected to the top surface 124-3 of the second reflective cup 124. The second lead frame 144 includes a second bent portion 522 and a second horizontal portion 524. The second bent portion 522 may be bent from the top surface 124-3 of the second reflective cup 124 toward the back 107 of the body 110. The angle formed between the second bent portion 522 and the top surface 124-3 of the second reflective cup 124 may be an acute angle.

The second bent portion 522 may have at least one second hole 503. A portion of the body 110 may fill the second hole 503. The second horizontal portion 524 may be connected to the second bent portion 522. The second horizontal portion 524 may extend in parallel with the bottom of the second reflective cup 124. A part of the second horizontal portion 524 may be exposed from the second side wall 220 and bottom surface 107 of the body 110.

Referring to FIG. 2, the first reflective cup 122 may extend through the body 110 such that a bottom surface 202 of the first reflective cup 122 is exposed from the bottom surface 107 of the body 110. The end 142 of the first reflective cup 122 may also extend through the first side wall 210 of the body 110 such that the end 142 is protruded from the first side wall 210 to be exposed to the outside of the body 110.

The second reflective cup 124 may extend through the body 110 such that a bottom surface 204 of the second reflective cup 124 is exposed from the back 107 of the body 110. The end 144 of the second reflective cup 124 may also extend through the second side wall 220 of the body 110 such that the end 144 is protruded from the second side wall 220 to be exposed to the outside of the body 110. The exposed end 142 of the first reflective cup 122 and the exposed end 144 of the second reflective cup 124 may have various shapes such as a rectangular shape, a square shape, and a U-shape.

Since the ends 142 and 144 and bottom surfaces 202 and 204 of the first and second reflective cups 122 and 124 are exposed to the outside of the body 110, it may be possible to enhance the efficiency of emitting, to the outside of the body 110, heat generated from the first and second light emitting devices 132 and 134.

The first connection pad 126 is disposed in the body 110 under the top of the body 110 while being spaced apart from the first and second reflective cups 122 and 124. The second connection pad 128 is disposed in the body 110 under the top of the body 110 while being spaced apart from the first and second reflective cups 122 and 124 and the first connection pad 126. For example, the first and second connection pads 126 and 128 may be disposed under the bottom 103 of the body cavity 105 while being spaced apart from each other. The bottom 103 of the body cavity 105 may be exposed between the first connection pad 126 and the first reflective cup 122, between the first connection pad 126 and the second reflective cup 124, and between the first connection pad 126 and the second connection pad 128.

The first connection pad 126 is disposed adjacent to one side surface 120 included in one of the side surface pairs of the body cavity 105, each of which includes two facing side surfaces 120. The second connection pad 128 is disposed adjacent to the other side surface 120 included in the side surface pair of the body cavity 105, which includes the side surface 120 disposed adjacent to the first connection pad 126.

The first connection pad 126 may be disposed adjacent to one of two facing first facets 311 and 313 or two facing first facets 312 and 314, and the second connection pad 128 may be disposed adjacent to the other of two facing first facets 311 and 313 or two facing first facets 312 and 314. For example, the center of the first connection pad 126 may be aligned with the center of one of the associated facing first facets 311, whereas the center of the second connection pad 128 may be aligned with the center of the other of the associated facing first facets 313.

The first and second connection pads 126 and 128 may be symmetrically disposed under the bottom 103 of the body cavity 105. The first and second connection pads 126 and 128 may be aligned with each other while facing each other. For example, the center of the first connection pad 126 may be aligned with the center of the second connection pad 129.

Also, the first and second connection pads 126 and 128 may be arranged to be laterally symmetrical with respect to a first reference line 410. The first reference line 410 may be a line connecting the centers of the facing facets 312 and 314.

The first connection pad 126 may include an upper portion 610 exposed from the bottom of the body cavity 105, and an end 146 extending through a third side wall 230 of the body 110 such that a portion of the end 146 can be exposed. Hereinafter, the end 146 of the first connection pad 126 will be referred to as a "third lead frame".

The third lead frame 146 is connected to the upper portion 610 of the first connection pad 126. The third lead frame 146 includes a third bent portion 532 and a third horizontal portion 534. The third bent portion 532 may be bent from the upper portion 610 of the first connection pad 126 toward the back 107 of the body 110. The angle formed between the third bent portion 532 and the upper portion 610 of the first connection pad 126 may be an acute angle. The third horizontal portion 534 may be connected to the third bent portion 532. The third horizontal portion 534 may extend in parallel with the upper portion 610 of the first connection pad 126. A part of the third horizontal portion 534 may be exposed from the third side wall 230 and back 107 of the body 110.

The second connection pad 128 may include an upper portion 620 exposed from the bottom of the body cavity 105, and an end 148 extending through a fourth side wall 240 of the body 110 such that a portion of the end 148 is exposed. Hereinafter, the end 148 of the second connection pad 128 will be referred to as a "fourth lead frame".

The fourth lead frame 148 is connected to the upper portion 620 of the second connection pad 128. The fourth lead frame 148 includes a fourth bent portion 542 and a fourth horizontal portion 544. The fourth bent portion 542 may be bent from the upper portion 620 of the second connection pad 128 toward the back 107 of the body 110. The angle formed between the fourth bent portion 542 and the upper portion 620 of the second connection pad 128 may be an acute angle. The fourth horizontal portion 544 may be connected to the fourth bent portion 542. The fourth horizontal portion 544 may extend in parallel with the upper portion 620 of the second connection pad 128. A part of the fourth horizontal portion 544 may be exposed from the fourth side wall 240 and back 107 of the body 110. The first to fourth bent portions 512, 522, 532, and 542 may be disposed in the body 110 without being exposed to the outside of the body 110.

The upper portion 610 of the first connection pad 126 has a thickness T31 of 200 to 300 µm. The third lead frame 146 has a thickness T32 of 0.2 to 0.3 mm. The upper portion 620 of the second connection pad 128 has a thickness T41 of 200 to 300 µm. The fourth lead frame 148 has a thickness T42 of 0.2 to 0.3 mm.

Each of the first and second connection pads 126 and 128 should have a sufficient area to provide a bonding area for wires. For example, the first connection pad 126 may have a minimum diameter of 0.15 mm or more passing through the center of the first connection pad 126, and the second connection pad 128 may have a minimum diameter of 0.15 mm or more passing through the center of the second connection pad 128.

Since the first and second connection pads 126 and 128 are symmetrically disposed under the bottom 103 of the body cavity 105 in the illustrated embodiment, the first and second reflective cups 122 and 124 may be disposed in the body 110 in a stable and balanced state. Accordingly, it may be possible to prevent the first and second light emitting devices 132 and 134 from being twisted when the first and second light emitting devices 132 and 134 are bonded to the first and second reflective cups 122 and 124, respectively.

A portion of each of the first and second connection pads 126 and 128 may extend through the body 110 to be exposed to the outside of the body 110.

For example, the end 146 of the first connection pad 126 may be exposed from the back 107 of the body 110 while extending through the third side wall 230 of the body 110 to be exposed to the outside of the body 110. The third side wall 230 of the body 110 may be perpendicular to the first and second side walls 210 and 220 of the body 110. Also, the end 148 of the second connection pad 128 may be exposed from the back 107 of the body 110 while extending through the fourth side wall 240 of the body 110 to be exposed to the outside of the body 110. The fourth side wall 240 of the body 110 may be perpendicular to the first and second side walls 210 and 220 of the body 110.

The first reflective cup 122, second reflective cup 124, first connection pad 126, and second connection pad 128 may be made of a conductive material. For example, the first reflective cup 122, second reflective cup 124, first connection pad 126, and second connection pad 128 may be made of a metal such as silver, gold, or copper, or a metal body coated with such a metal.

The first reflective cup 122, second reflective cup 124, first connection pad 126, and second connection pad 128 may be made of a material different from that of the body 110, and may not be integral with the body 110. The first and second reflective cups 122 and 124 may have the same shape and size. The first and second connection pads 126 and 128 may have the same shape and size.

The zener diode 150 is disposed on one of the first and second reflective cups 122 and 124 so as to improve the withstand voltage of the semiconductor light emitting device package 100. For example, the zener diode 150 is disposed on the top surface 122-3 or 124-3 of one of the first and second reflective cups 122 and 124. In the embodiment of FIG. 1, the zener diode 150 is mounted on the top surface 124-3 of the second reflective cup 124. However, the present invention is not limited to this embodiment.

The first semiconductor light emitting device 132 is disposed in the first cavity 162 of the first reflective cup 122. The second semiconductor light emitting device 134 is disposed in the second cavity 164 of the second reflective cup 124. For example, the first semiconductor light emitting device 132 may be disposed on the bottom 122-1 of the first reflective cup 122, and the second semiconductor light emitting device 134 may be disposed on the bottom 124-1 of the second reflective cup 124.

The first semiconductor light emitting device 132 may be spaced apart from the side surfaces 122-2 of the first reflective cup 122, whereas the second semiconductor light emitting device 134 may be spaced apart from the side surfaces 124-2 of the second reflective cup 124.

Each of the first and second light emitting devices 132 and 134 may have a width of 400 to 1,200 µm, a length of 400 to 1,200 µm, and a thickness of 100 to 200 µm. For example, each of the first and second light emitting devices 132 and 134 may have a chip size including a width×length of 800 µm×400 µm and a thickness of 100 to 150 µm.

The first semiconductor light emitting device 132, second semiconductor light emitting device 134, and first connection pad 126 are electrically connected by wires 152, 154, 156, and 158. The first wire 154 electrically connects the first semiconductor light emitting device 132 and first reflective cup 122. The second wire 154 electrically connects the first semiconductor light emitting device 132 and first connection pad 126. The third wire 156 electrically connects the first connection pad 126 and second semiconductor light emitting device 134. The fourth wire 158 electrically connects the second semiconductor light emitting device 134 and second reflective cup 124.

The zener diode 150 mounted on the top surface 124-3 of the second reflective cup 124 and the first reflective cup 122 may be electrically connected by a fifth wire 159. For example, one end of the fifth wire 159 may be bonded to the zener diode 150, and the other end of the fifth wire 159 may be bonded to the top surface 122-3 of the first reflective cup 122.

Where the zener diode 150 is mounted on the top surface 122-3 of the first reflective cup 122, different from the case of FIG. 1, one end of the fifth wire 159 may be bonded to the zener diode 150, and the other end of the fifth wire 159 may be bonded to the top surface 124-3 of the second reflective cup 124.

The first connection pad 126 is spaced apart and electrically isolated from the first and second reflective cups 122 and 124. Accordingly, the first connection pad 126 is electrically independent of the first and second light emitting devices 132 and 134. In this regard, the first connection pad 126 serially connects the first and second light emitting devices 132 and 134 in an electrically stable state, so that an enhancement in electrical reliability may be achieved.

Each of the first and second light emitting devices 132 and 134 is not only a device for emitting light, but also a heat source for emitting heat. The first reflective cup 122 prevents heat emitted from the first semiconductor light emitting device 132 from being radiated to the body 110. The second reflective cup 124 prevents heat emitted from the second semiconductor light emitting device 134 from being radiated to the body 110. That is, the first and second reflective cups 122 and 124 thermally isolate the first and second light emitting devices 132 and 134 from each other. Also, the first and second reflective cups 122 and 124 have a light shielding function to prevent light emitted from the first semiconductor light emitting device 132 and light emitted from the second semiconductor light emitting device 134 from interfering with each other.

In particular, in the illustrated embodiment, the thermal isolation effects of the first and second reflective cups 122 and 124 are further enhanced because the first and second reflective cups 122 and 124 are formed in the bottom 103 of the body 110, and a portion of the bottom 103 is interposed between the first and second reflective cups 122 and 124. Also, it may be possible to further suppress light interference occurring between the first and second light emitting devices 132 and 134. Thus, in the illustrated embodiment, it may be possible to thermally and optically isolate the first and second light emitting devices 132 and 134 from each other.

FIG. 7 is a plan view of the semiconductor light emitting device package 100 shown in FIG. 1. For convenience of description, the wires 151 to 159 shown in FIG. 1 are not shown in FIG. 7.

Referring to FIGS. 1 and 7, the first and second reflective cups 122 and 124 are spaced apart from each other by a predetermined distance D1. A portion 103-1 of the bottom 103 of the body 110 is interposed between the first and second reflective cups 122 and 124. As described above, the body 110 may be made of polyphthalamide (PPA).

In order to isolate the heat sources, namely, the light emitting devices 132 and 134, from each other and to effectively prevent light interference from occurring between the light emitting devices 132 and 134, the distance D1 between the first and second reflective cups 122 and 124 is preferably 100 μm or more.

Also, in order to effectively prevent light interference from occurring between the light emitting devices 132 and 134 while achieving an enhancement in reflection efficiency, the first semiconductor light emitting device 132 is disposed on the bottom 122-1 of the first reflective cup 122 while being spaced apart from the side surfaces 122-2 of the first reflective cup 122 by a predetermined distance. Also, the second semiconductor light emitting device 134 is disposed on the bottom 124-1 of the second reflective cup 124 while being spaced apart from the side surfaces 124-2 of the second reflective cup 124 by a predetermined distance.

The distances from respective facing side surfaces 122-2 of the first reflective cup 122 to the first semiconductor light emitting device 132 may be equal or different. Also, the distances from respective facing side surfaces 124-2 of the second reflective cup 124 to the second semiconductor light emitting device 134 may be equal or different. In addition, the distance D21 from each shorter side surface 122-2 of the first reflective cup 122 to the first semiconductor light emitting device 132 may be equal to or different from the distance D22 from each shorter side surface 124-2 of the second reflective cup 124 to the second semiconductor light emitting device 134.

For example, the distance D21 from each shorter side surface 122-2 of the first reflective cup 122 to the first semiconductor light emitting device 132 may be 150 to 250 μm, and the distance D31 from each longer side surface 122-2 of the first reflective cup 122 to the first semiconductor light emitting device 132 may be 400 to 600 μm. Also, the distance D22 from each shorter side surface 124-2 of the second reflective cup 124 to the second semiconductor light emitting device 134 may be 150 to 250 μm, and the distance D32 from each longer side surface 124-2 of the second reflective cup 124 to the second semiconductor light emitting device 134 may be 400 to 600 μm.

The pitch P between the first semiconductor light emitting device 132 disposed in the first reflective cup 122 and the second semiconductor light emitting device 134 disposed in the second reflective cup 124 may be 2 to 3 mm.

The first semiconductor light emitting device 132 may be mounted on a central portion of the bottom of the first reflective cup 122, whereas the second semiconductor light emitting device 134 may be mounted on a central portion of the bottom of the second reflective cup 124. For example, the distance D2 from each shorter side surface 122-2 of the first reflective cup 122 to the first semiconductor light emitting device 132 may be 200 μm, and the distance D31 from each longer side surface 122-2 of the first reflective cup 122 to the first semiconductor light emitting device 132 may be 500 μm.

The first connection pad 126 is spaced apart from each of the first and second reflective cups 122 and 124 by a predetermined distance D4. The bottom 103 of the body 110, which is made of PPA, is interposed between the first connection pad 126 and each of the first and second reflective cups 122 and 124.

For example, the distance between the first reflective cup 122 and the first connection pad 126, namely, the distance D4, may be equal to the distance between the second reflective cup 124 and the first connection pad 126, namely, the distance D4. Also, the distance between the first reflective cup 122 and the second connection pad 128 may be equal to the distance between the second reflective cup 124 and the second connection pad 128.

The distance D4 between the first connection pad 126 and each of the first and second reflective cups 122 and 124 may be equal to the distance D1 between the first and second reflective cups 122 and 124. Also, the distance between the second connection pad 128 and each of the first and second reflective cups 122 and 124 may be equal to the distance D1 between the first and second reflective cups 122 and 124.

The second connection pad 128 is spaced apart from each of the first and second reflective cups 122 and 124 by a predetermined distance. The bottom 103 of the body 110, which is made of PPA, is interposed between the second connection pad 128 and each of the first and second reflective cups 122 and 124.

The distance between the first reflective cup 122 and the first connection pad 126 may be equal to the distance between the first reflective cup 122 and the second connection pad 128. Also, the distance between the second reflective cup 124 and the first connection pad 126 may be equal to the distance between the second reflective cup 124 and the second connection pad 128.

Figure 8:
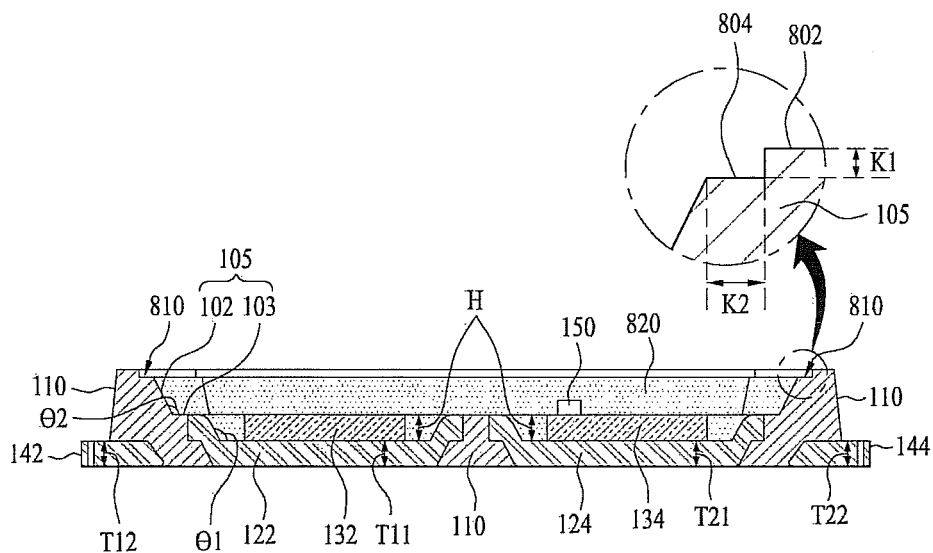
FIG. 8 is a cross-sectional view taken along the line A-A' of FIG. 7.
Figure 9:
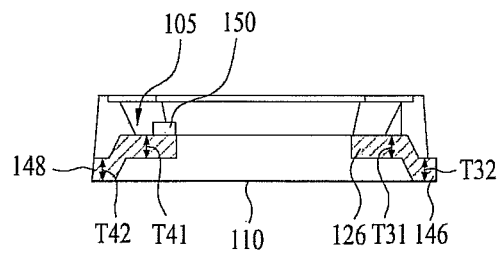
FIG. 9 is a cross-sectional view taken along the line B-B' of FIG. 7.

FIG. 8 is a cross-sectional view taken along the line A-A' of FIG. 7. FIG. 9 is a cross-sectional view taken along the line B-B' of FIG. 7. In FIGS. 8 and 9, the wires 152 to 159 are not shown.

Referring to FIGS. 8 and 9, the tilt angle of the side surfaces of the first reflective cup 122, namely, an angle θ1, may be equal to or different from the tilt angle of the side surfaces 102 of the body cavity 105. For example, the angle θ1 formed between each side surface of the first reflective cup 122 and the bottom of the first reflective cup 122 may be 90 to 160°.

The angle formed between each side surface 102 of the body cavity 105 and the bottom 103 of the body cavity 105, namely, an angle θ2, may be 140 to 170°. The upper end of each side surface 102 of the body cavity 105 has a bent edge. The upper end of each side surface 102 may have a bent shape. That is, the body cavity 105 has edges 804 disposed between a top surface 802 of the body 110 and the bottom 103 and stepped from the top surface 802 while extending in parallel to the top surface 802. For example, the upper end of each side surface 102 of the body cavity 105 may have the edge 804, which is stepped from the top surface 802 of the body 110 while extending in parallel to the top surface 802.

In this case, a step K1, which may have a height of 50 µm to 80 µm, may be formed between the top surface 802 of the body cavity 105 and the edge 804. The edge 804 may have a length K2 of 50 µm to 130 µm. At the upper end of each side surface 102 of the body cavity 105, at least one step having the above-described structure may be formed.

As the edge 804 having the above-described step is provided at the upper end of each side surface 102 of the body cavity 105, it may be possible to lengthen the penetration path of gas, and thus to prevent external gas from penetrating into the semiconductor light emitting device package. Thus, the semiconductor light emitting device package 100 may have enhanced sealability.

The first reflective cup 122 may have a thickness T11 of 200 µm to 300 µm. For example, the first reflective cup 122 may have a thickness of 200 µm to 300 µm at portions thereof respectively corresponding to the bottom 122-1, side surfaces 122-2, and top surface 122-3. The second reflective cup 124 may have a thickness T21 of 200 µm to 300 µm. For example, the second reflective cup 124 may have a thickness of 200 µm to 300 µm at portions thereof respectively corresponding to the bottom 124-1, side surfaces 124-2, and top surface 124-3.

The first reflective cup 122 has a thickness 142 of 0.2 mm to 0.3 mm at one end thereof exposed from the first side wall 210 of the body 110. The second reflective cup 124 has a thickness 144 of 0.2 mm to 0.3 mm at one end thereof exposed from the second side wall 220 of the body 110.

The top surface 122-3 of the first reflective cup 122 and the top surface 124-3 of the second reflective cup 124 may be parallel to the bottom 103 of the body cavity 105. The top surfaces of the first and second connection pads 126 and 128 may be parallel to the top surfaces of the first and second reflective cups 122 and 124.

The present invention is not limited to this embodiment. The bottom 103 of the body cavity 105 may be disposed at a higher level than the top surface 122-3 of the first reflective cup 122, the top surface 124-3 of the second reflective cup 124, and the top surfaces of the first and second connection pads 126 and 128.

The thickness T31 of the first connection pad 126 may be 200 µm to 300 µm. The thickness T32 of the end 146 of the first connection pad 126 exposed to the outside of the body 110 may be 0.2 mm to 0.3 mm. The thickness T41 of the second connection pad 128 may be 200 µm to 300 µm. The thickness T42 of the end 148 of the second connection pad 128 exposed to the outside of the body 110 may be 0.2 mm to 0.3 mm.

As shown in FIG. 8, the semiconductor light emitting device package according to the illustrated embodiment, an encapsulation material 820 may be filled in the body cavity 105 to protect the first and second light emitting devices 132 and 134 in a sealed state.

The encapsulation material 820 may also be filled in the first reflective cup 122, in which the first semiconductor light emitting device 132 is mounted, and the second reflective cup 124, in which the second semiconductor light emitting device 134 is mounted, as well as the body cavity 105, so as to isolate the first and second light emitting devices 132 and 134 from the outside.

The encapsulation material 820 may be a silicon material or a resin material. Filling of the encapsulation material 820 may be achieved by filling the body cavity 105 with a silicon material or a resin material, and then curing the silicon or resin material. Of course, filling of the encapsulation material 820 is not limited to the above-described method.

The encapsulation material 820 includes phosphors to change characteristics of light emitted from the first and second light emitting devices 132 and 134. Light emitted from the first and second light emitting devices 132 and 134 is excited by the phosphors and thus renders various colors.

For example, if the light emitting devices 132 and 134 are blue light emitting diodes and the phosphors are yellow phosphors, blue light is excited by the yellow phosphors, thereby rendering white light. If the light emitting devices 132 and 134 emit ultraviolet (UV) light, the encapsulation material 820 includes three-color phosphors, namely, red (R), green (G) and blue (B) phosphors, so as to render white light. Further, a lens (not shown) may be additionally formed on the encapsulation material 820 so as to adjust distribution of light emitted by the semiconductor light emitting device package 100.

In order to prevent light interference between the light emitting devices 132 and 134 and to achieve an enhancement in light reflection efficiency, the depths of the first and second reflective cups 122 and 124 may be determined, taking into consideration the heights of the light emitting devices 132 and 134.

Figure 22A:
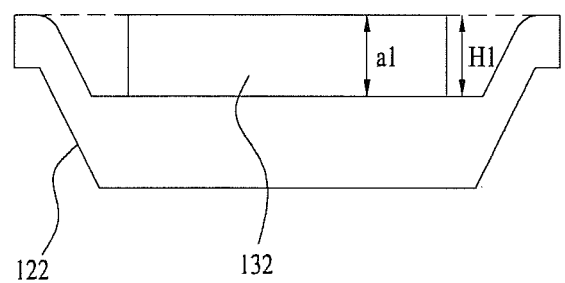
FIG. 22A is a view illustrating the depth of the first reflective cup in accordance with an exemplary embodiment of the present invention.

FIG. 22A illustrates a depth H1 of the first reflective cup 122 in accordance with an exemplary embodiment of the present invention.

Referring to FIG. 22A, the top surface 122-3 of the first reflective cup 122 may be flush with the top surface of the first semiconductor light emitting device 132 mounted on the bottom 122-1 of the first reflective cup 122. The depth H1 of the first reflective cup 122 may be equal to the height of the first semiconductor light emitting device 132, namely, a1, (H1=a1). Here, the depth H1 may be the distance between the top surface 122-3 and bottom 122-1 of the first reflective cup 122. The description of the first reflective cup 122 shown in FIG. 22A may be identically applied to the second reflective cup 124.

Figure 22B:
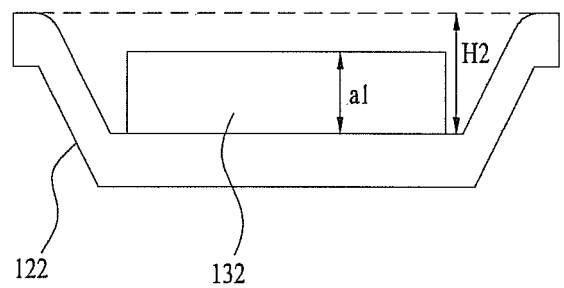
FIG. 22B is a view illustrating the depth of the first reflective cup in accordance with another embodiment of the present invention.

FIG. 22B illustrates a depth H2 of the first reflective cup in accordance with another embodiment of the present invention.

Referring to FIG. 22B, the upper surface 122-3 of the first reflective cup 122 may be higher than the upper surface of the first semiconductor light emitting device 132 mounted on the bottom 122-1 of the first reflective cup 122. That is, the depth H2 of the first reflective cup 122 may be greater than the height a1 of the first semiconductor light emitting device 132 (H2>a1). For example, the depth H2 of the first reflective cup 122 may be greater than the height a1 of the first semiconductor light emitting device 132 and may be less than twice the height a1 of the first semiconductor light emitting device 132 (a1<H2<2a1). The description of the first reflective cup 122 shown in FIG. 22B may be identically applied to the second reflective cup 124.

Figure 22C:
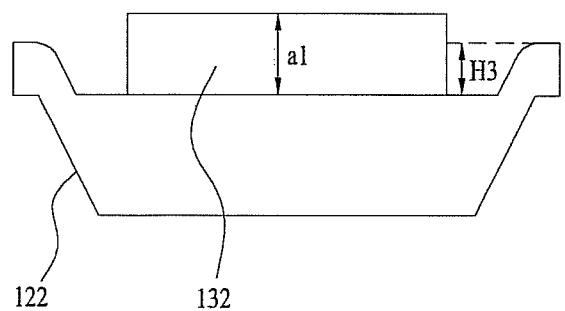
FIG. 22C is a view illustrating the depth of the first reflective cup in accordance with another embodiment of the present invention.

FIG. 22C is a view illustrating a depth H3 of the first reflective cup in accordance with another embodiment of the present invention.

Referring to FIG. 22C, the upper surface 122-3 of the first reflective cup 122 may be lower than the upper surface of the first semiconductor light emitting device 132 mounted on the bottom 122-1 of the first reflective cup 122. The depth H3 of the first reflective cup 122 may be less than the height a1 of the first semiconductor light emitting device 132 (H3<a1).

For example, the depth H3 of the first reflective cup 122 may be less than the height a1 of the first semiconductor light emitting device 132 and may be greater than half the height a1 of the first semiconductor light emitting device 132 (a1/

2<H3<a1). The description of the first reflective cup 122 shown in FIG. 22C may be identically applied to the second reflective cup 124.

Figure 10:
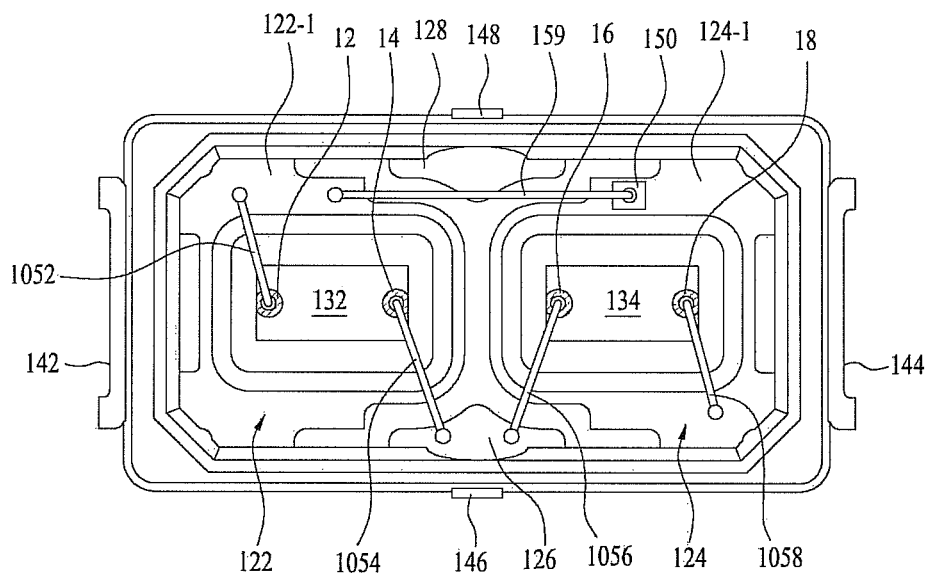
FIG. 10 is a plan view illustrating serial connection between light emitting devices in a semiconductor light emitting device package according to an exemplary embodiment of the present invention.

FIG. 10 illustrates serial connection between the light emitting devices in the semiconductor light emitting device package according to an exemplary embodiment of the present invention. Referring to FIG. 10, first to fourth wires 1052 to 1058 are shown. The first wire 1052 may have one end bonded to the top surface 122-3 of the first reflective cup 122 and the other end bonded to the first semiconductor light emitting device 132. The second wire 1054 may have one end bonded to the first semiconductor light emitting device 132 and the other end bonded to the first connection pad 126.

The third wire 1056 may have one end bonded to the first connection pad 126 and the other end bonded to the second semiconductor light emitting device 134. The fourth wire 1058 may have one end bonded to the second semiconductor light emitting device 134 and the other end bonded to the top surface 124-3 of the second reflective cup 134.

The light emitting devices 132 and 134 shown in FIG. 10 may be electrically connected in series by the first to fourth wires 1052 to 1058 bonded thereto. The serial connection between the light emitting devices 132 and 134 shown in FIG. 10 is achieved using, as a medium, the connection pad 126, which is independent of the light emitting devices 132 and 134. Accordingly, it may be possible to stably connect the first and second light emitting devices 132 and 134 in series, and thus to enhance the electrical reliability of the semiconductor light emitting device package.

Figure 11:
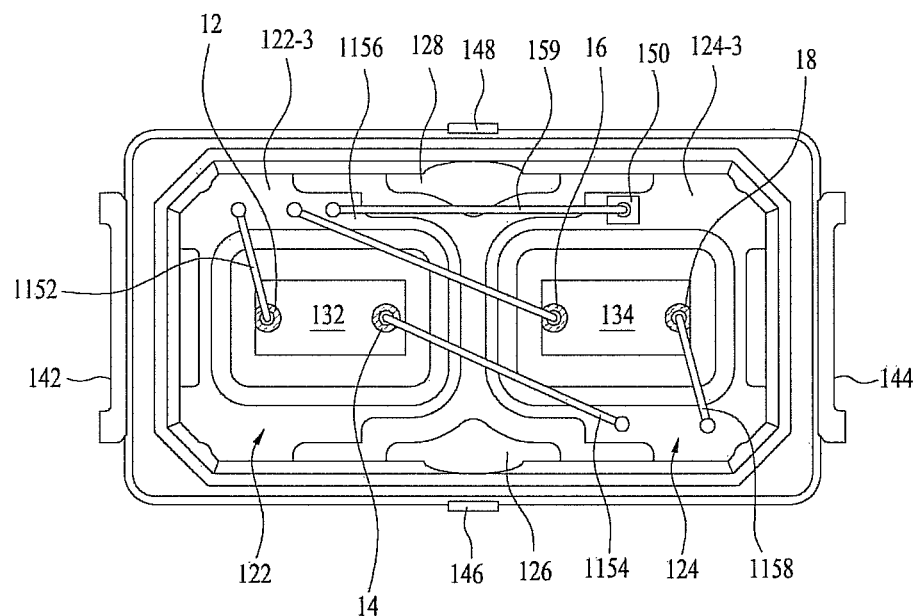
FIG. 11 is a plan view illustrating parallel connection between light emitting devices in a semiconductor light emitting device package according to an exemplary embodiment of the present invention.

FIG. 11 illustrates parallel connection between the light emitting devices of the semiconductor light emitting device package according to another embodiment of the present invention. Referring to FIG. 11, first to fourth wires 1152 to 1158 are shown. The first wire 1152 may have one end bonded to the top surface 122-3 of the first reflective cup 122 and the other end bonded to the first semiconductor light emitting device 132.

The second wire 1154 may have one end bonded to the first semiconductor light emitting device 132 and the other end bonded to the top surface 124-3 of the second reflective cup 124. The third wire 1156 may have one end bonded to the top surface 122-3 of the first reflective cup 122 and the other end bonded to the second semiconductor light emitting device 134. The fourth wire 1158 may have one end bonded to the second semiconductor light emitting device 134 and the other end bonded to the top surface 124-3 of the second reflective cup 134. Thus, the light emitting devices 132 and 134 shown in FIG. 11 may be electrically connected in parallel by the first to fourth wires 1152 to 1158 bonded thereto.

Figure 12:
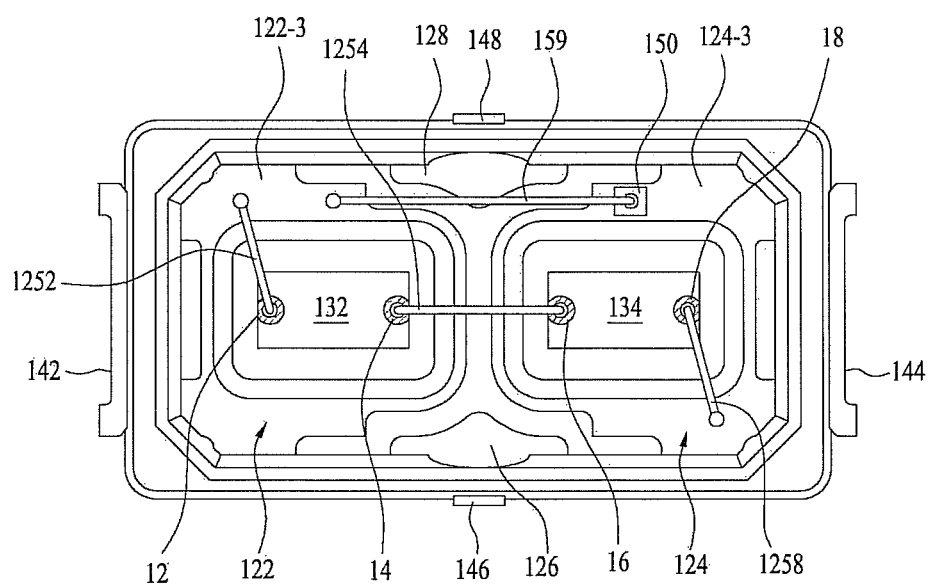
FIG. 12 is a plan view illustrating serial connection between light emitting devices in a semiconductor light emitting device package according to another embodiment of the present invention.

FIG. 12 illustrates serial connection between the light emitting devices in the semiconductor light emitting device package according to another embodiment of the present invention. Referring to FIG. 12, first to third wires 1252 to 1258 are shown. The first wire 1252 may have one end bonded to the top surface 122-3 of the first reflective cup 122 and the other end bonded to the first semiconductor light emitting device 132. The second wire 1254 may have one end bonded to the first semiconductor light emitting device 132 and the other end bonded to the second semiconductor light emitting device 134. The third wire 1258 may have one end bonded to the second semiconductor light emitting device 134 and the other end bonded to the top surface 124-3 of the second reflective cup 124.

In the case of FIG. 12, the light emitting devices 132 and 134 may be electrically connected in series by the first to third wires 1252 to 1258 bonded thereto. Different from the case of FIG. 10, the first and second light emitting devices 132 and 134 may be directly connected by the second wire 1254 without using the connection pad 126 as a medium.

The levels of the first reflective cup 122, second reflective cup 124, first semiconductor light emitting device 132, second semiconductor light emitting device 134, and zener diode 150 may be lower than the level of the top surface 106 of the body cavity 105.

The above-described embodiments are not associated with a single cup-type semiconductor light emitting device package, but are associated with a semiconductor light emitting device package structure in which the light emitting devices 132 and 134 are mounted in two separate reflective cups 122 and 124 in the body 110. Through such a structure, the light emitting devices 132 and 134 serving as heat sources are isolated from each other and heat generated by the light emitting devices 132 and 134 is blocked by the reflective cups 122 and 124, thereby preventing discoloration of the body 110 of the semiconductor light emitting device package 100 due to heat and thus extending the lifespan of the semiconductor light emitting device package 100. Further, the two separate reflective cups 122 and 124 prevent light interference between the light emitting devices 132 and 134.

Figure 29:
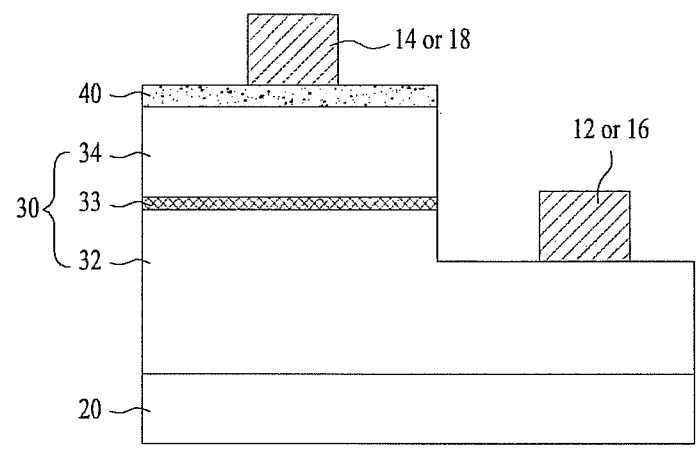
FIG. 29 is a sectional view illustrating an exemplary embodiment of the first and second light emitting devices shown in FIG. 1

FIG. 29 is a sectional view illustrating an exemplary embodiment of the first and second light emitting devices 132 and 134 shown in FIG. 1. Referring to FIG. 29, the first semiconductor light emitting device 132 includes a substrate 20, a light emitting structure 30, a conductive layer 40, a first electrode 12, and a second electrode 14. The second semiconductor light emitting device 134 includes the substrate 20, the light emitting structure 30, the conductive layer 40, a third electrode 14, and a fourth electrode 18. The second semiconductor light emitting device 134 shown in FIG. 1 may have the same configuration as the first semiconductor light emitting device 132. The first and second electrodes 12 and 14 have different polarities, and the third and fourth electrodes 16 and 18 have different polarities.

The substrate 20 supports the light emitting structure 30. The substrate 20 may be one of a substrate made of a material having light transmittance, for example, a sapphire substrate, a silicon (Si) substrate, a zinc oxide (ZnO) substrate, and a nitride semiconductor substrate, or a template substrate laminated with at least one of GaN, InGaN, AlGaN, AlInGaN, SiC, GaP, InP, Ga2O3, and GaAs.

The light emitting structure 30 includes a first-conductivity type semiconductor layer 32, an active layer 33, and a second-conductivity type semiconductor layer 34. The first-conductivity type semiconductor layer 32 may include, for example, an n-type semiconductor layer. The n-type semiconductor layer may be made of a semiconductor material having a formula of $In_xAl_yGa_{1-x-y}N$ ($0 \le x \le 1$, $0 \le y \le 1$, and $0 \le x+y \le 1$). For example, the semiconductor material may be selected from GaN, AlN, AlGaN, InGaN, InN, InAlGaN, or AlInN. The n-type semiconductor layer may be doped with an n-type dopant such as Si, Ge, Sn, Se, or Te.

The active layer 33 may be disposed over the first-conductivity type semiconductor layer 32. The active layer 33 may be made of a semiconductor material having a formula of $In_xAl_yGa_{1-x-y}N$ ($0 \le x \le 1$, $0 \le y \le 1$, and $0 \le x+y \le 1$). For example, the active layer 33 may have at least one of a quantum wire structure, a quantum dot structure, a single quantum well structure, and a multi-quantum well (MQW) structure.

The active layer 33 may generate light, using energy generated during recombination of electrons and holes provided from the first-conductivity type semiconductor layer 32 and second-conductivity type semiconductor layer 34. The active layer 33 may generate light of various wavelengths. There is no limitation as to the range of the light generated from the active layer 33.

The second-conductivity type semiconductor layer 34 is disposed over the active layer 33. The second-conductivity type semiconductor layer 34 may be implemented by, for example, a p-type semiconductor layer. The p-type semiconductor layer may be made of a semiconductor material having a formula of $In_xAl_yGa_{1-x-y}N$ ($0 \leq x \leq 1$, $0 \leq y \leq 1$, and $0 \leq x+y \leq 1$). For example, the semiconductor material of the p-type semiconductor layer may be selected from GaN, AlN, AlGaN, InGaN, InN, InAlGaN, or AlInN. The p-type semiconductor layer may be doped with a p-type dopant such as Mg, Zn, Ca, Sr, or Ba.

In the light emitting structure 30, the second-conductivity type semiconductor layer 34, active layer 33, and first-conductivity type semiconductor layer 32 may be partially mesa-etched to expose a portion of the first-conductivity type semiconductor layer 32.

The conductive layer 40 is disposed over the second-conductivity type semiconductor layer 34. The conductive layer 40 may not only reduce full reflection, but also enhance the efficiency of extracting light emitted from the active layer 33 to the second-conductivity type semiconductor layer 34 by virtue of excellent transmittance thereof. The conductive layer 40 may be made of a transparent oxide-based material exhibiting high transmissivity at wavelengths of emitted light. For example, the transparent oxide-based material may include indium tin oxide (ITO), tin oxide (TO), indium zinc oxide (IZO), indium tin zinc oxide (ITZO), or zinc oxide (ZnO). In another embodiment, the conductive layer 40 may be dispensed with.

The first electrode 12 or third electrode 16 may be disposed on the exposed portion of the first-conductivity type semiconductor layer 32. The second electrode 14 or fourth electrode 18 may be disposed on the second-conductivity type semiconductor layer 34 or conductive layer 40. The first electrode 12 and third electrode 16 may be n-type electrodes, whereas the second electrode 14 and fourth electrode 18 may be p-type electrodes. The first to fourth electrodes 12, 14, 16, and 18 may be made of a metal material, for example, at least one metal material selected from Ti, Al, Al alloy, In, Ta, Pd, Co, Ni, Si, Ge, Ag, Ag alloy, Au, Hf, Pt, Ru, Au, and alloys thereof. Each of the first to fourth electrodes 12, 14, 16, and 18 may have a single-layer structure or multi-layer structure. Referring to FIGS. 10 to 12, the first to fourth electrodes 12 to 18 are illustrated.

Referring to FIG. 10, one of the first and second electrodes 12 and 14 may be electrically connected to the first reflective cup 122, and one of the third and fourth electrodes 16 and 18 may be electrically connected to the second reflective cup 124. The first connection pad 126 may electrically connect the other of the first and second electrodes 12 and 14 and the other of the third and fourth electrodes 16 and 18.

For example, the first electrode 12 of the first semiconductor light emitting device 132 may be electrically connected to the first reflective cup 122 by the first wire 1052. The fourth electrode 18 of the second semiconductor light emitting device 134 may be electrically connected to the second reflective cup 124 by the fourth wire 1058.

The first connection pad 126 may electrically connect the second electrode 14 of the first semiconductor light emitting device 122 and the third electrode 16 of the second semiconductor light emitting device 124 by the second and third wires 1054 and 1056.

The second electrode 14 of the first semiconductor light emitting device 132 may be electrically connected to the first connection pad 126 by the second wire 1054. The third electrode 16 of the second semiconductor light emitting device 134 may be electrically connected to the first connection pad 126 by the third wire 1056.

Referring to FIG. 11, one of the first and second electrodes 12 and 14 may be electrically connected to the first reflective cup 122, and one of the third and fourth electrodes 16 and 18 may be electrically connected to the second reflective cup 124. The other of the first and second electrodes 12 and 14 may be electrically connected to the second reflective cup 124, and the other of the third and fourth electrodes 16 and 18 may be electrically connected to the first reflective cup 122.

For example, the first electrode 12 of the first semiconductor light emitting device 132 may be electrically connected to the first reflective cup 122 by the first wire 1152. The fourth electrode 18 of the second semiconductor light emitting device 134 may be electrically connected to the second reflective cup 124 by the fourth wire 1158.

The second electrode 14 may be electrically connected to the second reflective cup 124 by the second wire 1154, and the third electrode 16 may be electrically connected to the first reflective cup 122 by the third wire 1156.

Referring to FIG. 12, one of the first and second electrodes 12 and 14 may be electrically connected to the first reflective cup 122, and one of the third and fourth electrodes 16 and 18 may be electrically connected to the second reflective cup 124. The other of the first and second electrodes 12 and 14 may be electrically connected to the other of the third and fourth electrodes 16 and 18.

For example, the first electrode 12 of the first semiconductor light emitting device 132 may be electrically connected to the first reflective cup 122 by the first wire 1252. The fourth electrode 18 of the second semiconductor light emitting device 134 may be electrically connected to the second reflective cup 124 by the third wire 1258. The second electrode 14 may be electrically connected to the third electrode 16 by the second wire 1254.

Figure 13:
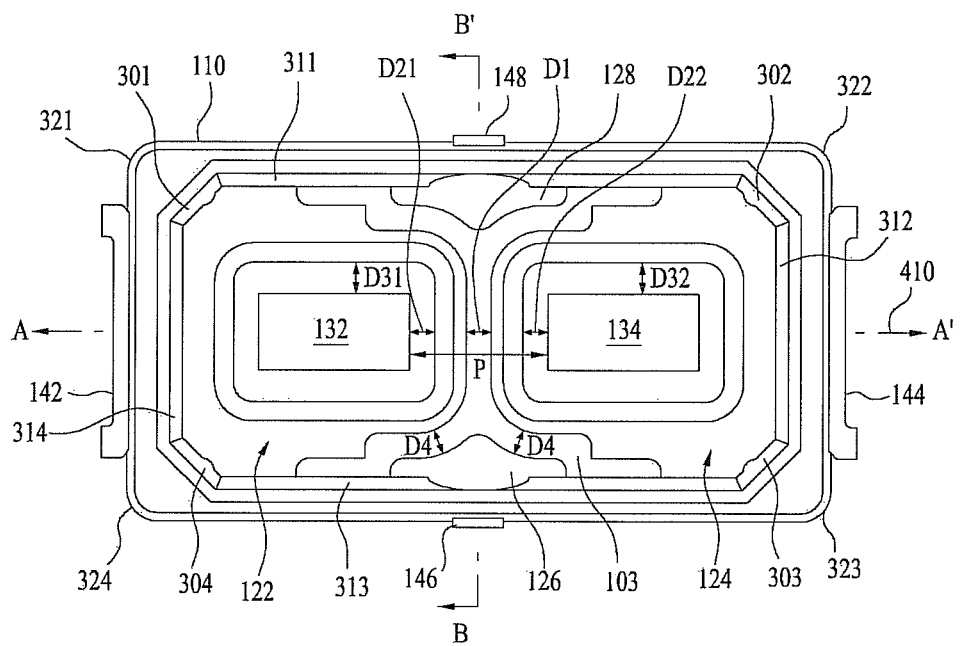
FIG. 13 is a plan view of a semiconductor light emitting device package according to another embodiment of the present invention.
Figure 14:
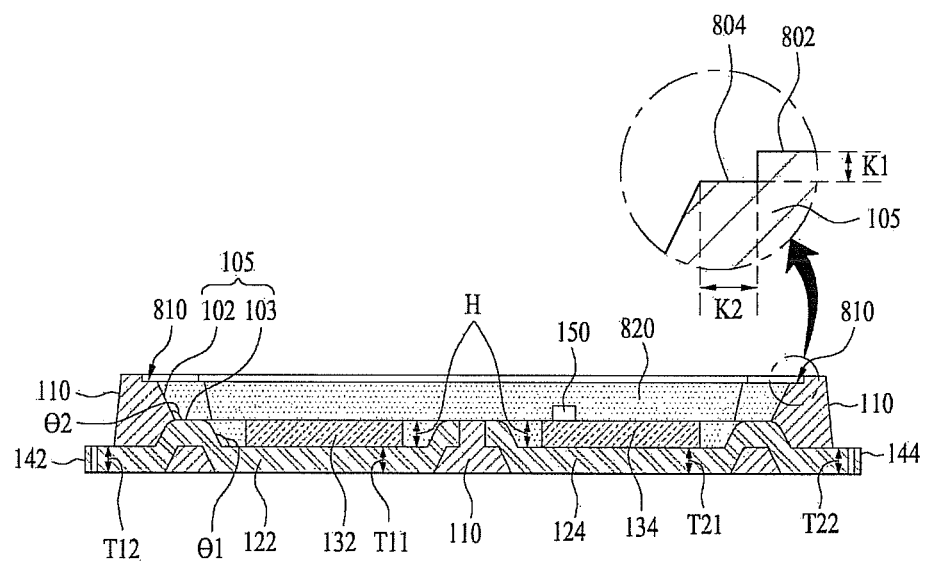
FIG. 14 is a cross-sectional view taken along the line A-A' of FIG. 13.
Figure 18:
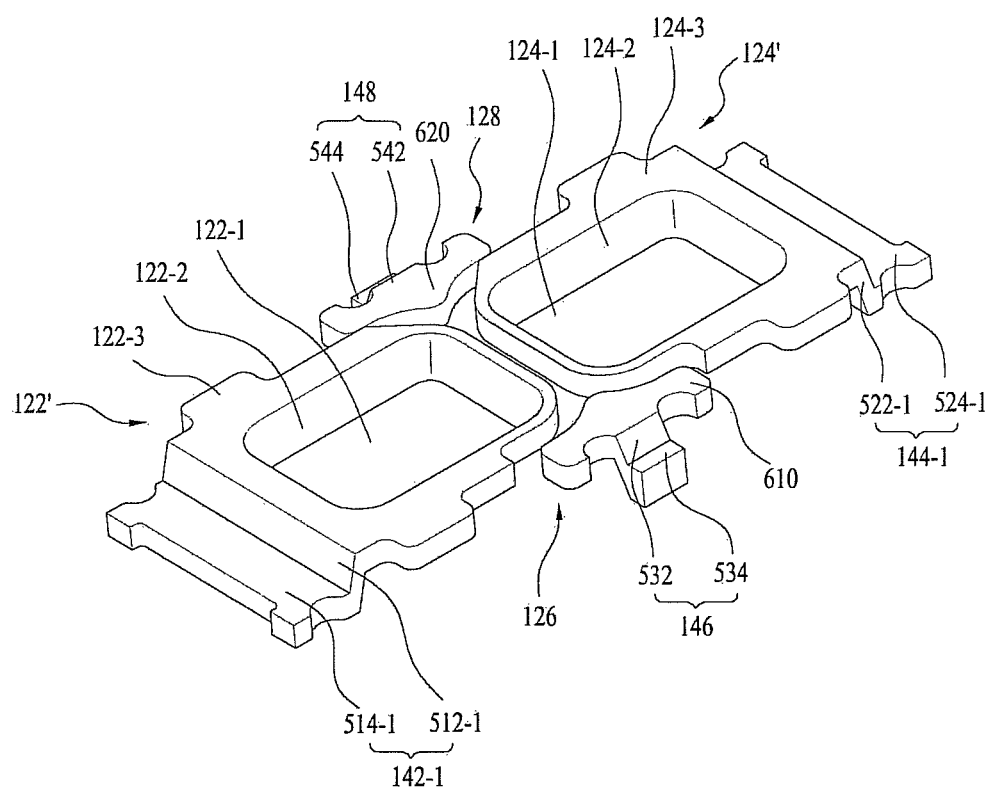
FIG. 18 is a perspective view illustrating first and second reflective cups and first and second connection pads shown in FIG. 13.

FIG. 13 is a plan view of a semiconductor light emitting device package according to another embodiment of the present invention. FIG. 14 is a cross-sectional view taken along the line A-A' of FIG. 13. FIG. 18 illustrates a first reflective cup 122', a second reflective cup 124', a first connection pad 126, and a second connection pad 128, which are shown in FIG. 13.

As shown in FIG. 18, the first reflective cup 122' includes a first lead frame 142-1. The first lead frame 142-1 includes a first bent portion 512-1 and a first horizontal portion 514-1. The second reflective cup 124' includes a second lead frame 144-1. The second lead frame 144-1 includes a second bent portion 522-1 and a second horizontal portion 524-1. The first and second bent portions 512-1 and 522-1 shown in FIG. 18 do not have a hole, different from the first and second bent portions 512 and 522 shown in FIG. 17.

Figure 15:
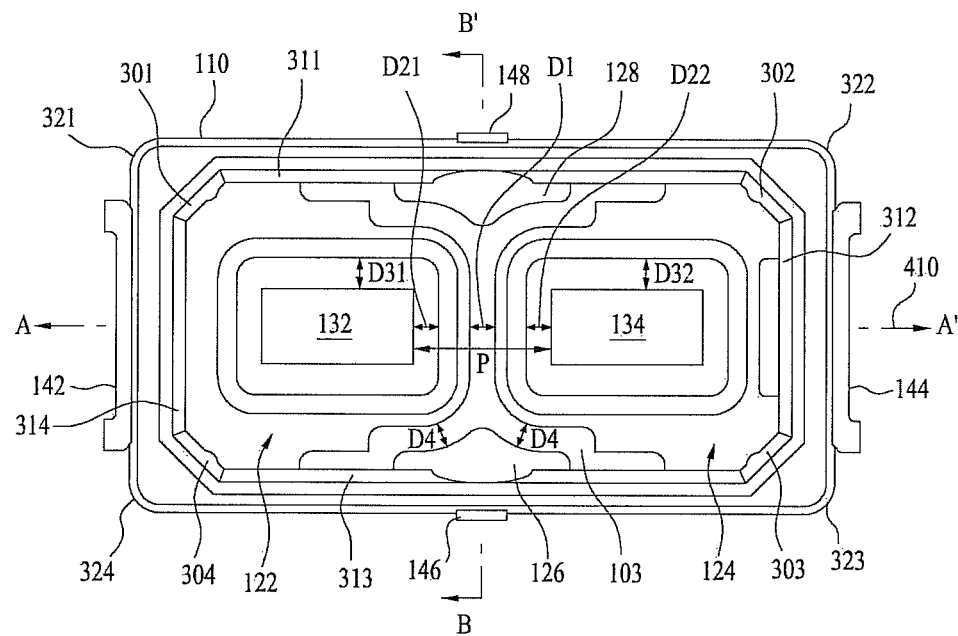
FIG. 15 is a plan view of a semiconductor light emitting device package according to another embodiment of the present invention.
Figure 16:
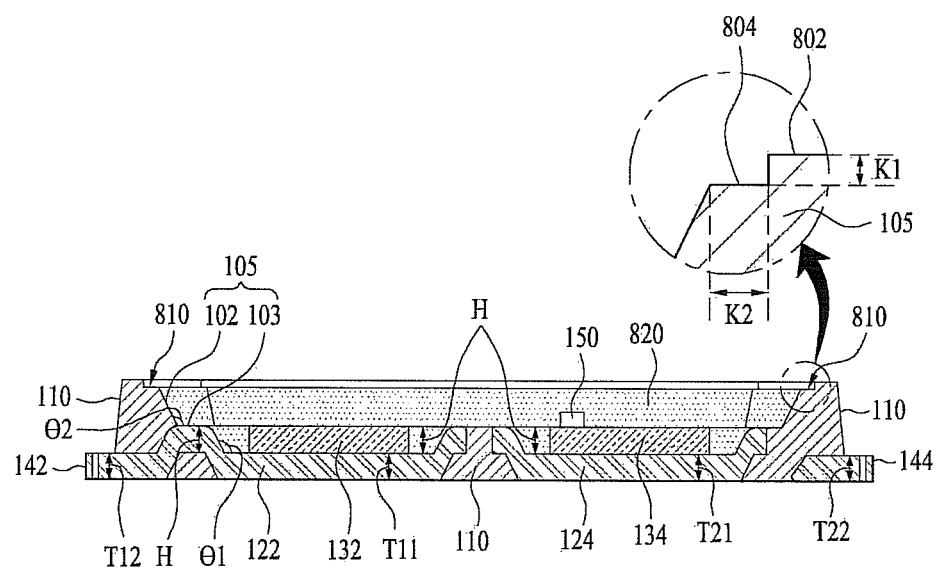
FIG. 16 is a cross-sectional view taken along the line A-A' of FIG. 15.
Figure 19:
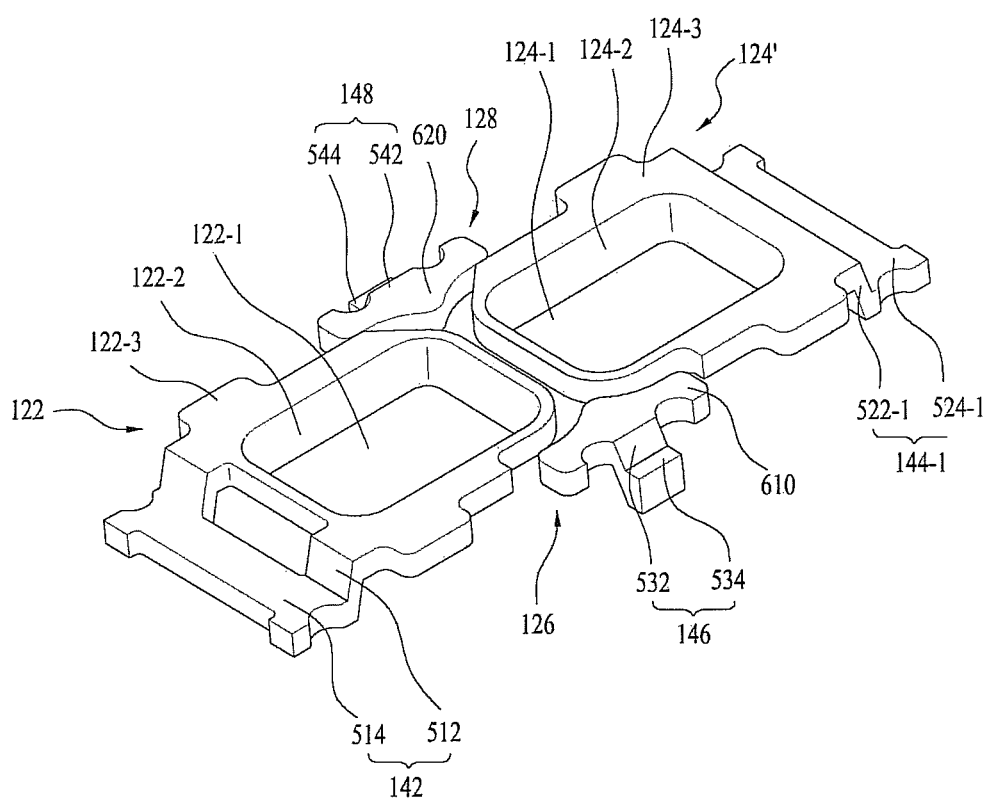
FIG. 19 is a perspective view illustrating first and second reflective cups and first and second connection pads shown in FIG. 15.

FIG. 15 is a plan view of a semiconductor light emitting device package according to another embodiment of the present invention. FIG. 16 is a cross-sectional view taken along the line A-A' of FIG. 15. FIG. 19 illustrates a first reflective cup 122, a second reflective cup 124', a first connection pad 126, and a second connection pad 128, which are shown in FIG. 15.

As shown in FIG. 19, the first reflective cup 122 includes a first lead frame 142. The first lead frame 142 includes a first bent portion 512 and a first horizontal portion 514. The second reflective cup 124' includes a second lead frame 144-1. The second lead frame 144-1 includes a second bent portion 522-1 and a second horizontal portion 524-1. The first bent portion 512 shown in FIG. 19 may be identical to the structure of FIG. 17, whereas the second bent portion 522-1 shown in FIG. 19 may be identical to the structure of FIG. 18.

That is, the first bent portion 512 of the first lead frame 142 in the first reflective cup 122 shown in FIG. 19 may have at least one hole, whereas the second bent portion 522-1 of the second lead frame 144-1 in the second reflective cup 124' may not have a hole.

Figure 20:
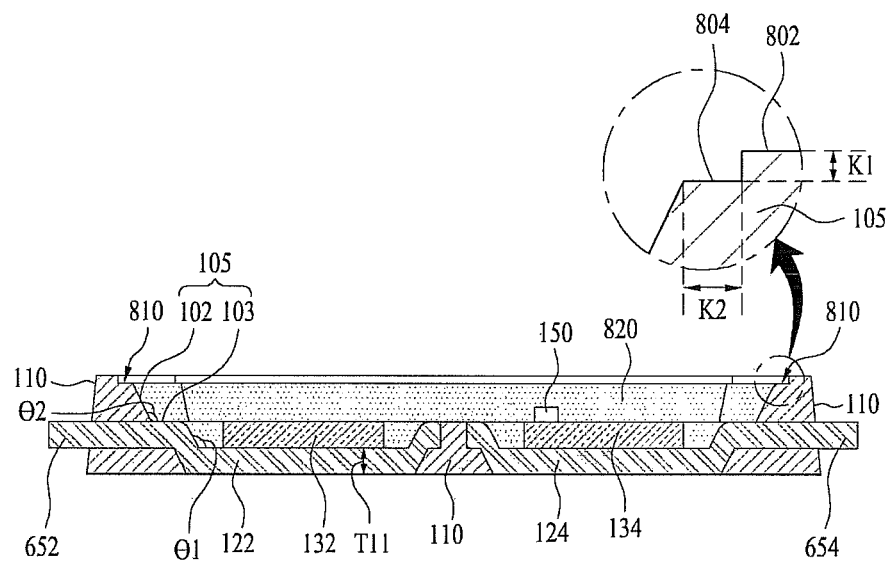
FIG. 20 is a sectional view illustrating first and second lead frames respectively included in first and second reflective cups according to another embodiment of the present invention.

FIG. 20 illustrates first and second lead frames 652 and 654 respectively included in first and second reflective cups 122 and 124 according to another embodiment of the present invention.

Referring to FIG. 20, the first lead frame 652 is connected to the top surface 122-3 of the first reflective cup 122. The first lead frame 652 extends through the first side wall 210 of the body 110 to be exposed to the outside of the body 110. The first lead frame 652 may extend in parallel to the top surface 122-3 of the first reflective cup 122. Also, the portion of the first lead frame 652 exposed from the first side wall 210 of the body 110 may extend in parallel to the top surface 122-3 of the first reflective cup 122.

The second lead frame 654 is connected to the top surface 124-3 of the second reflective cup 124. The second lead frame 654 extends through the second side wall 220 of the body 110 to be exposed to the outside of the body 110. The second lead frame 654 may extend in parallel to the top surface 124-3 of the second reflective cup 124. Also, the portion of the second lead frame 654 exposed from the second side wall 220 of the body 110 may extend in parallel to the top surface 124-3 of the second reflective cup 124.

Figure 21:
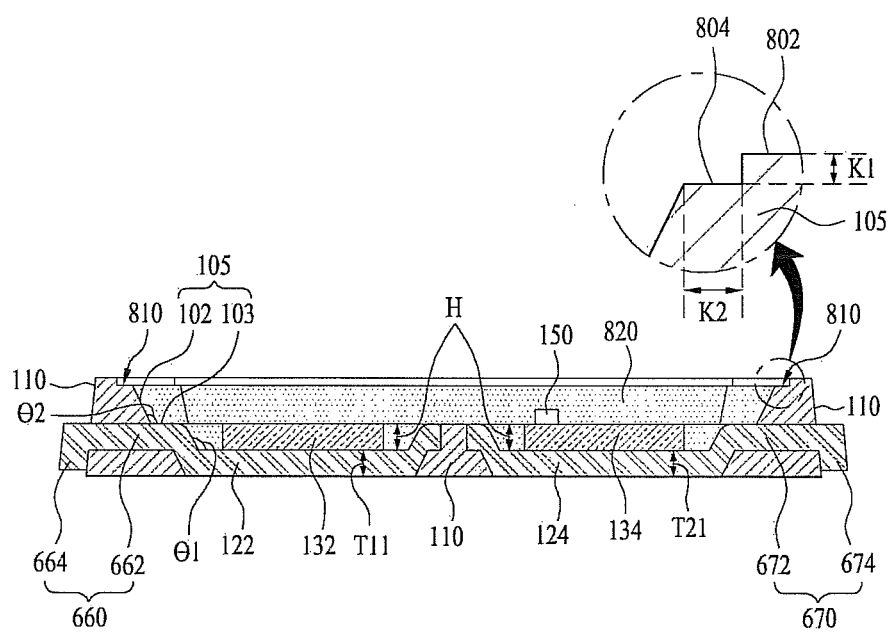
FIG. 21 is a sectional view illustrating first and second lead frames respectively included in first and second reflective cups according to another embodiment of the present invention.

FIG. 21 illustrates first and second lead frames 660 and 670 respectively included in first and second reflective cups 122 and 124 according to another embodiment of the present invention.

Referring to FIG. 21, the first lead frame 660 is connected to the top surface 122-3 of the first reflective cup 122. The first lead frame 660 extends through the first side wall 210 of the body 110 to be exposed to the outside of the body 110. The first lead frame 660 may include a horizontal portion 662 and an exposed bent portion 664.

The horizontal portion 662 is connected to the top surface 122-3 of the first reflective cup 122 while extending in parallel to the top surface 122-3 of the first reflective cup 122. Also, the exposed bent portion 664 may be connected to the horizontal portion 662, and may be exposed from the first side wall 210 of the body 110. The exposed bent portion 664 may contact an outer surface of the first side wall 210 of the body 110.

The second lead frame 670 of the second reflective cup 124 is connected to the top surface 124-3 of the second reflective cup 124. The second lead frame 670 extends through the second side wall 220 of the body 110 to be exposed to the outside of the body 110. The second lead frame 670 includes a horizontal portion 672 and an exposed bent portion 674.

The horizontal portion 672 is connected to the top surface 124-3 of the second reflective cup 124 while extending in parallel to the top surface 124-3 of the second reflective cup 124. The exposed bent portion 674 is connected to the horizontal portion 672 while being exposed from the second side wall 220 of the body 110. The exposed bent portion 674 may contact an outer surface of the second side wall 210 of the body 110.

Figure 23:
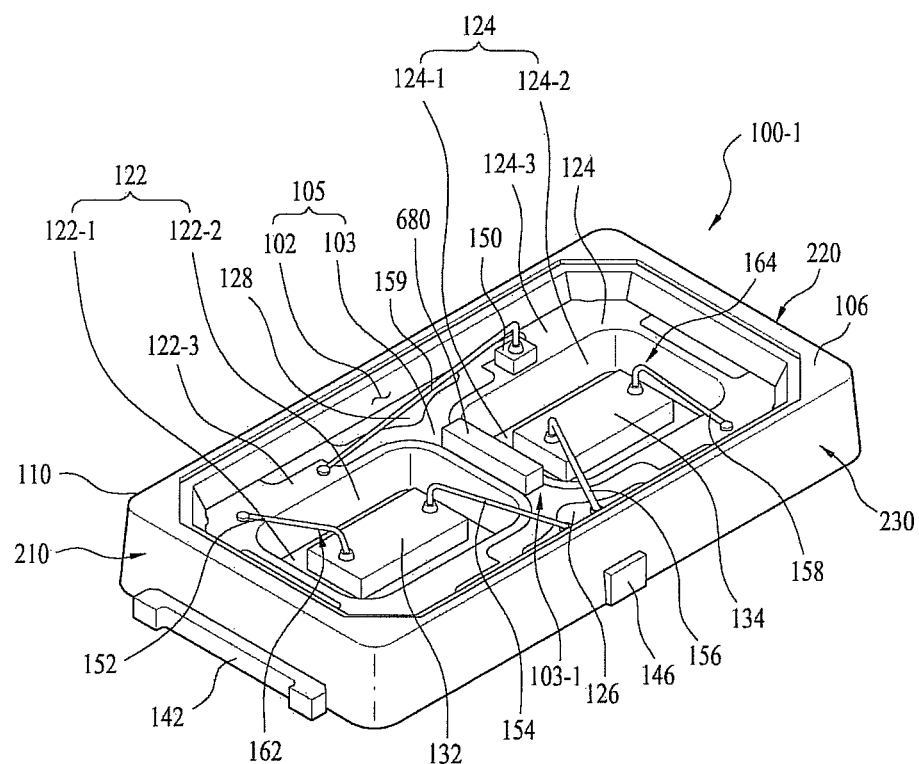
FIG. 23 is a perspective view illustrating a semiconductor light emitting device package according to another embodiment of the present invention.
Figure 24:
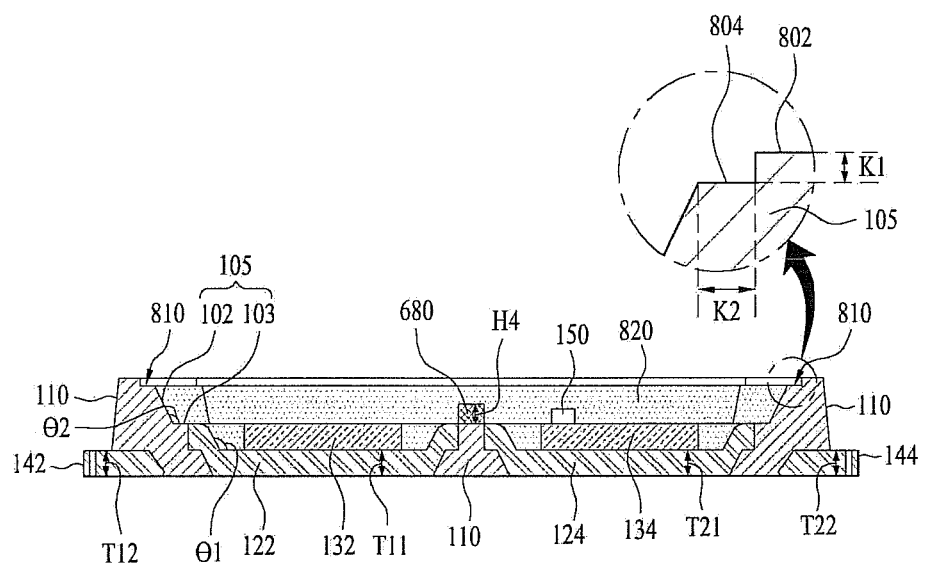
FIG. 24 is a sectional view of the semiconductor light emitting device package.

FIG. 23 illustrates a semiconductor light emitting device package 100-1 according to another embodiment of the present invention. FIG. 24 is a sectional view of the semiconductor light emitting device package 100-1 shown in FIG. 23.

Referring to FIGS. 23 and 24, the semiconductor light emitting device package 100-1 includes a body 110, a first reflective cup 122, a second reflective cup 124, a first connection pad 126, a second connection pad 128, a first semiconductor light emitting device 132, a second semiconductor light emitting device 134, a zener diode 150, wires 151 to 159, and a barrier wall 680. In FIGS. 23 and 24, the same reference numerals as those of FIG. 1 designate the same constituent elements as those of FIG. 1. Overlapping content will be omitted or more briefly described.

Referring to FIG. 23, the barrier wall 680 is disposed on a portion of the bottom 103 of the cavity 105 interposed between the first and second reflective cups 122 and 124. The barrier wall 680 functions to prevent light emitted from the semiconductor light emitting device 132 and light emitted from the second semiconductor light emitting device 134 from interfering with each other.

The height of the barrier wall 680, namely, H4, may be greater than the heights of the wires 152 to 158 bonded to the first and second light emitting devices 122 and 124 while being less than the height of the side surfaces 102 of the cavity 105. The barrier wall 680 may be made of the same material as the body 110, and may be integral with the bottom 103 of the cavity 105, even though it is not limited thereto.

The barrier wall 680 is not disposed on the remaining portion of the bottom 103 of the cavity 105, which is interposed between the first reflective cup 122 and the first connection pad 126, between the first reflective cup 122 and the second connection pad 128, between the second reflective cup 124 and the first connection pad 126, and between the second reflective cup 124 and the second connection pad 128.

The barrier wall 680 may protrude from the bottom 103 of the cavity 105 while having various shapes. In FIG. 23, the barrier wall 680 is a rectangular parallelepiped, even though it is not limited thereto. The barrier wall 680 may have various shapes such as a polyhedron, a hemi-sphere, a pyramid, and a dome.

Figure 25:
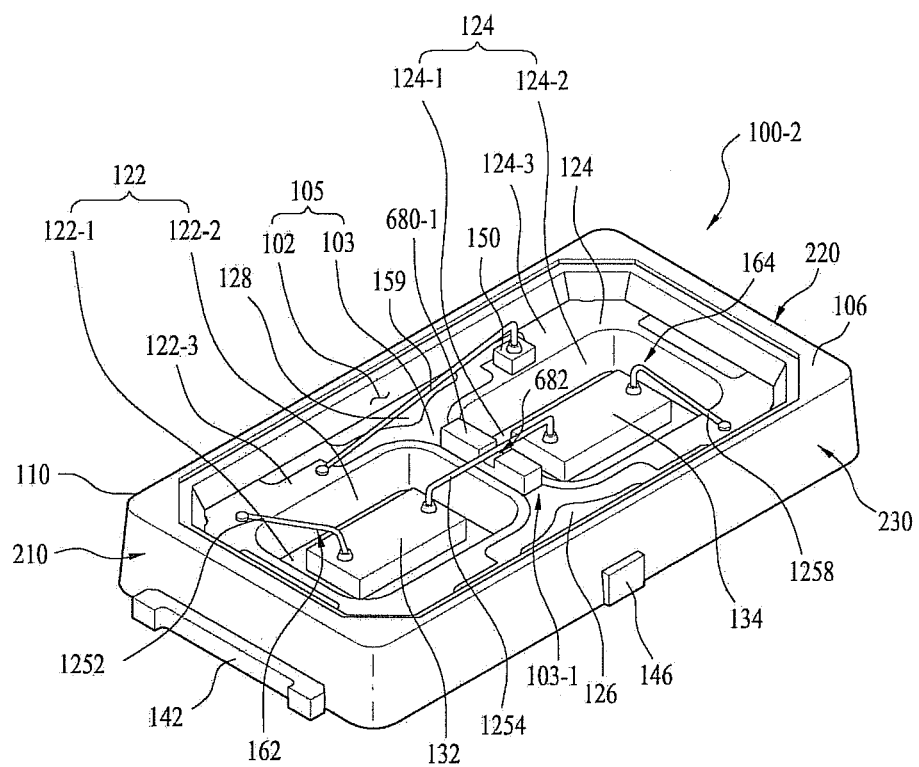
FIG. 25 is a perspective view illustrating a semiconductor light emitting device package according to another embodiment of the present invention.

FIG. 25 illustrates a semiconductor light emitting device package 100-2 according to another embodiment of the present invention. In FIG. 25, the same reference numerals as those of FIG. 1 designate the same constituent elements as those of FIG. 1. Overlapping content will be omitted or more briefly described. Connections of wires 1252, 1254, and 1258 shown in FIG. 25 represent serial connections shown in FIG. 12.

Referring to FIGS. 12 and 25, the semiconductor light emitting device package 100-2 includes a body 110, a first reflective cup 122, a second reflective cup 124, a first connection pad 126, a second connection pad 128, a first semiconductor light emitting device 132, a second semiconductor light emitting device 134, a zener diode 150, wires 1252, 1254, and 1258, and a barrier wall 680-1.

The barrier wall 680-1 has a similar shape to the barrier wall 680 shown in FIG. 23. However, the barrier wall 680-1 has a first groove 682. The first groove 682 is recessed from an upper surface of the barrier wall 680-1. The first groove 682 is opened at opposite sides of the barrier wall 680-1. For example, the first groove 682 may be upwardly opened while being opened toward the first and second reflective cups 124. The first groove 682 may be aligned with the second electrode 14 of the first semiconductor light emitting device 132 mounted in the first reflective cup 122 and the first electrode 16 of the second semiconductor light emitting device 134 mounted in the second reflective cup 124. Through the first groove 682, the bottom 103 of the cavity 105 may be exposed or may not be exposed.

The first wire 1252 electrically connects the first reflective cup 122 and the first electrode 12 of the first semiconductor light emitting device 122. The third wire 1258 electrically connects the second reflective cup 124 and the second electrode 18 of the second semiconductor light emitting device 124.

The second wire 1254 electrically connects the second electrode 14 of the first semiconductor light emitting device 122 and the third electrode 16 of the second semiconductor light emitting device 124. The second wire 1254 may connect the second electrode 14 and third electrode 16 via the groove 632. That is, a portion of the second wire 1254 may be disposed in the first groove 682.

When the first and second light emitting devices 122 and 124 shown in FIG. 23 are connected in series, the wires should be disposed above the barrier wall 680. For this reason, the wires may be readily broken.

In the case of FIG. 25, however, it may be possible to dispose the second wire 1254 at a lower level than the barrier wall 680-1 because the barrier wall 680-1 is provided with the first groove 682 allowing the second wire 1254 to extend therethrough. Thus, in this embodiment, it may be possible to prevent the second wire 1254, which directly connects the first and second light emitting devices 132 and 134, from being readily broken.

Figure 26:
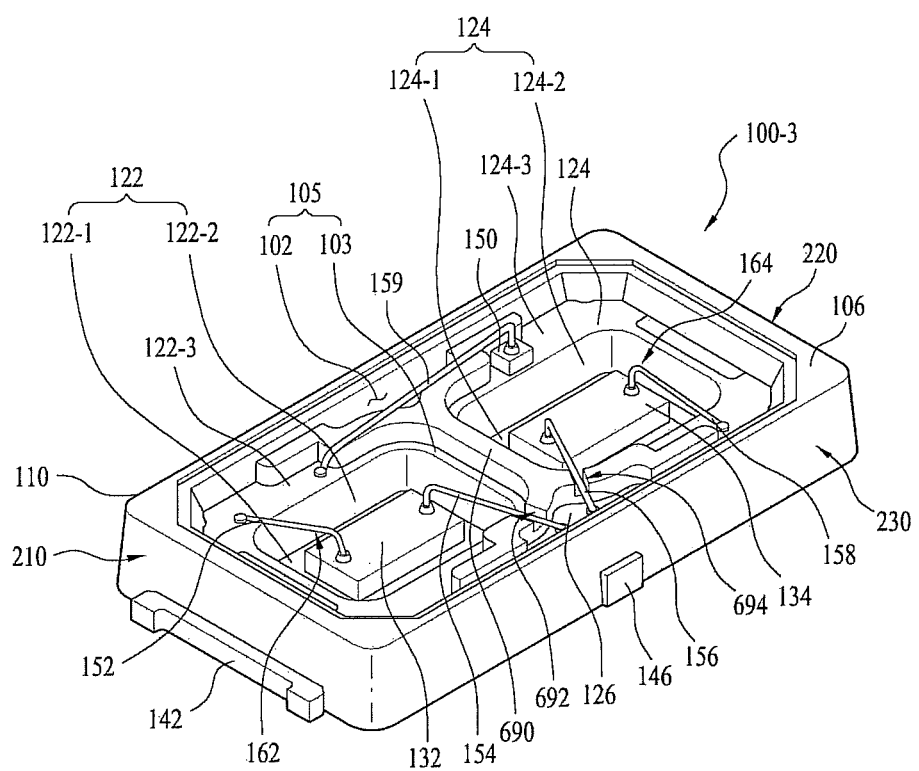
FIG. 26 is a perspective view illustrating a semiconductor light emitting device package according to another embodiment of the present invention.
Figure 27:
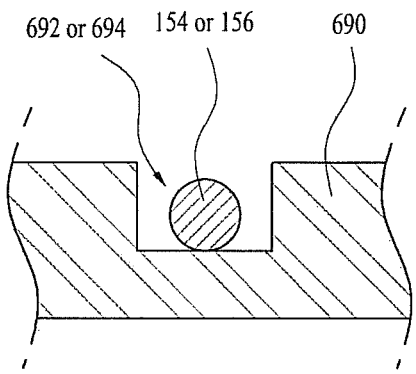
FIG. 27 is a sectional view illustrating second and third grooves shown in FIG. 26.

FIG. 26 illustrates a semiconductor light emitting device package 100-3 according to another embodiment of the present invention. FIG. 27 is a sectional view illustrating second and third grooves 692 and 694 shown in FIG. 26. In FIGS. 26 and 27, the same reference numerals as those of FIG. 1 designate the same constituent elements as those of FIG. 1. Overlapping content will be omitted or more briefly described.

Referring to FIGS. 26 and 27, the semiconductor light emitting device package 100-3 includes a body 110, a first reflective cup 122, a second reflective cup 124, a first connection pad 126, a second connection pad 128, a first semiconductor light emitting device 132, a second semiconductor light emitting device 134, a zener diode 150, wires 151 to 159, and a barrier wall 690.

The barrier wall 690 is disposed on portions of the bottom 103 of the cavity 105, which are interposed between the first and second reflective cups 122 and 124, between the first reflective cup 122 and the first connection pad 126, between the first reflective cup 122 and the second connection pad 128, between the second reflective cup 124 and the first connection pad 126, and between the second reflective cup 124 and the second connection pad 128, respectively. The barrier wall 690 may have the same height as the barrier wall 680 shown in FIG. 23.

The barrier wall 690 has a second groove 692, through which the second wire 154 extends, and a third groove 694, through which the third wire 156 extends. The second groove 692 is provided at a portion of the barrier wall 690 disposed between the first reflective cup 122 and the first connection pad 126. The third groove 694 is provided at another portion of the barrier wall 690 disposed between the second reflective cup 124 and the first connection pad 126. The fifth wire 159, which electrically connects the first reflective cup 122 and the zener diode 150, may be disposed over the barrier wall 690.

Figure 28:
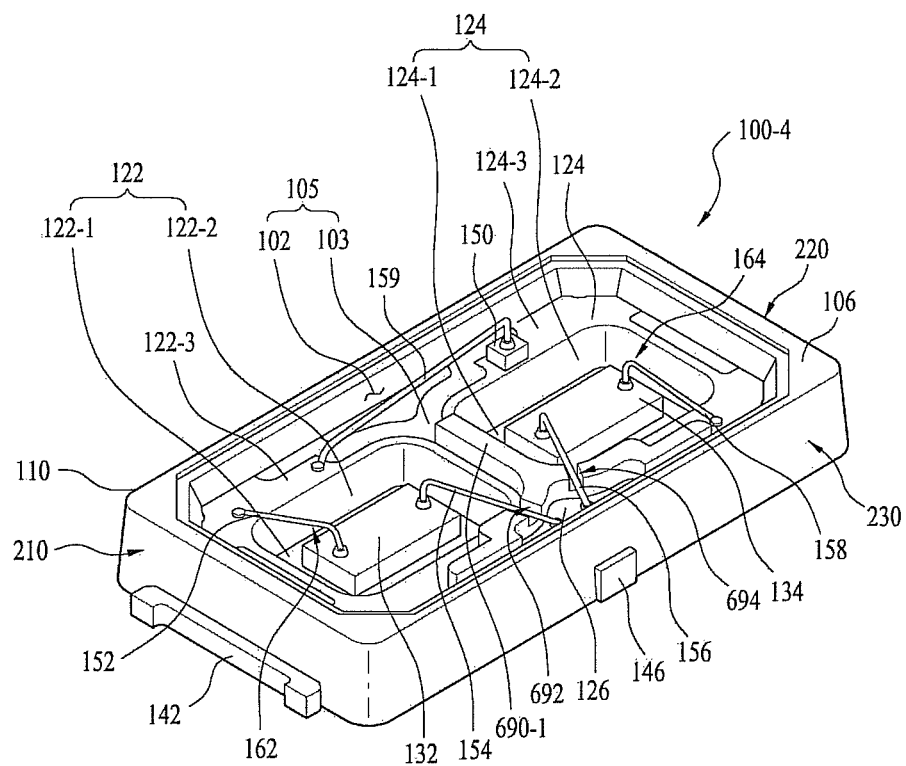
FIG. 28 is a perspective view illustrating a semiconductor light emitting device package according to another embodiment of the present invention.

FIG. 28 illustrates a semiconductor light emitting device package 100-4 according to another embodiment of the present invention. In FIG. 28, the same reference numerals as those of FIG. 1 designate the same constituent elements as those of FIG. 1. Overlapping content will be omitted or more briefly described.

Referring to FIG. 28, a barrier wall 690-1 is illustrated. The barrier wall 690-1 is disposed on portions of the bottom 103 of the cavity 105, which are interposed between the first and second reflective cups 122 and 124, between the first reflective cup 122 and the first connection pad 126, between the first reflective cup 122 and the second connection pad 128, and between the second reflective cup 124 and the first connection pad 126, respectively.

The barrier wall 690-1 has a second groove 692, through which the second wire 154 extends, and a third groove 694, through which the third wire 156 extends. The second groove 692 is provided at a portion of the barrier wall 690-1 disposed between the first reflective cup 122 and the first connection pad 126. The third groove 694 is provided at another portion of the barrier wall 690-1 disposed between the second reflective cup 124 and the first connection pad 126. The fifth wire 159 electrically connects the first reflective cup 122 and the zener diode 150.

In the embodiment of FIG. 26, the fifth wire 159 may be readily broken because it is disposed over the barrier wall 690. In the case of FIG. 28, however, it may be possible to dispose the fifth wire 159, which connects the first reflective cup 122 and the zener diode 150, at a lower level than the barrier wall 690-1 because the barrier wall 690-1 is not disposed between the first reflective cup 122 and the second connection pad 128 and between the second reflective cup 124 and the second connection pad 128. Thus, it may be possible to prevent the fifth wire 159 from being readily broken in that the level at which the fifth wire 159 is disposed can be lowered.

Figure 30:
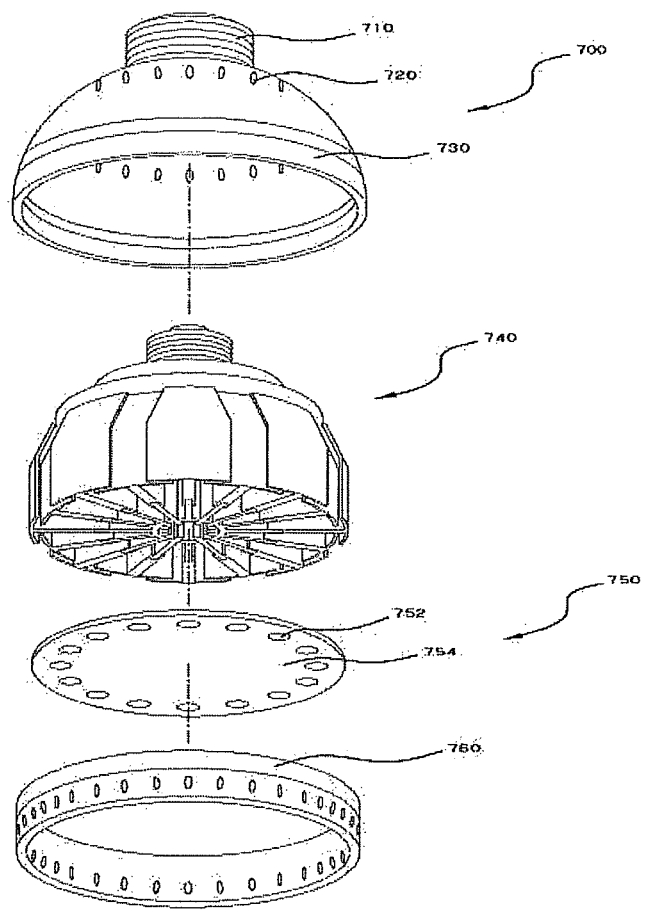
FIG. 30 is an exploded perspective view of a lighting apparatus with a semiconductor light emitting device package in accordance with an exemplary embodiment of the present invention.

FIG. 30 is an exploded perspective view of a lighting apparatus with a semiconductor light emitting device package in accordance with an exemplary embodiment of the present invention. Referring to FIG. 30, the lighting apparatus includes a light source 750 to project light, a housing 700 in which the light source 750 is installed, a heat dissipation unit 740 to dissipate heat of the light source 750, and a holder 760 to connect the light source 750 and the heat dissipation unit 740 to the housing 700.

The housing 700 includes a socket connection part 710 connected to an electric socket (not shown), and a body part 730 connected to the socket connection part 710. The light source 750 is received in the body part 730. A plurality of air holes 720 may be formed through the body part 730.

Although a plurality of air holes 720 are formed through the body part 730 of the housing 700 in the illustrated case, a single air hole 720 may be formed through the body part 730. Although the plural air holes 730 are circumferentially arranged, various arrangements thereof may be possible.

The light source 750 includes a substrate 754 and a plurality of semiconductor light emitting device packages 752 provided on the substrate 754. Here, the substrate 754 may have a shape corresponding to an opening of the housing 700 such that it can be fitted in the opening. Also, the substrate 754 may be made of a material having high thermal conductivity so as to transfer heat to the heat dissipation unit 740, as will be described later.

The holder 760 is disposed under the light source 750. The holder 760 includes a frame and air holes. Although not shown, an optical member may be disposed under the light source 750 so as to diffuse, scatter or converge light projected from the semiconductor light emitting device packages 752 of the light source 750. The lighting apparatus in accordance with this embodiment employs the semiconductor light emitting device package in accordance with one of the former embodiments, thereby extending the lifespan of the semiconductor light emitting device packages mounted on the lighting apparatus and preventing light interference.

Figure 31:
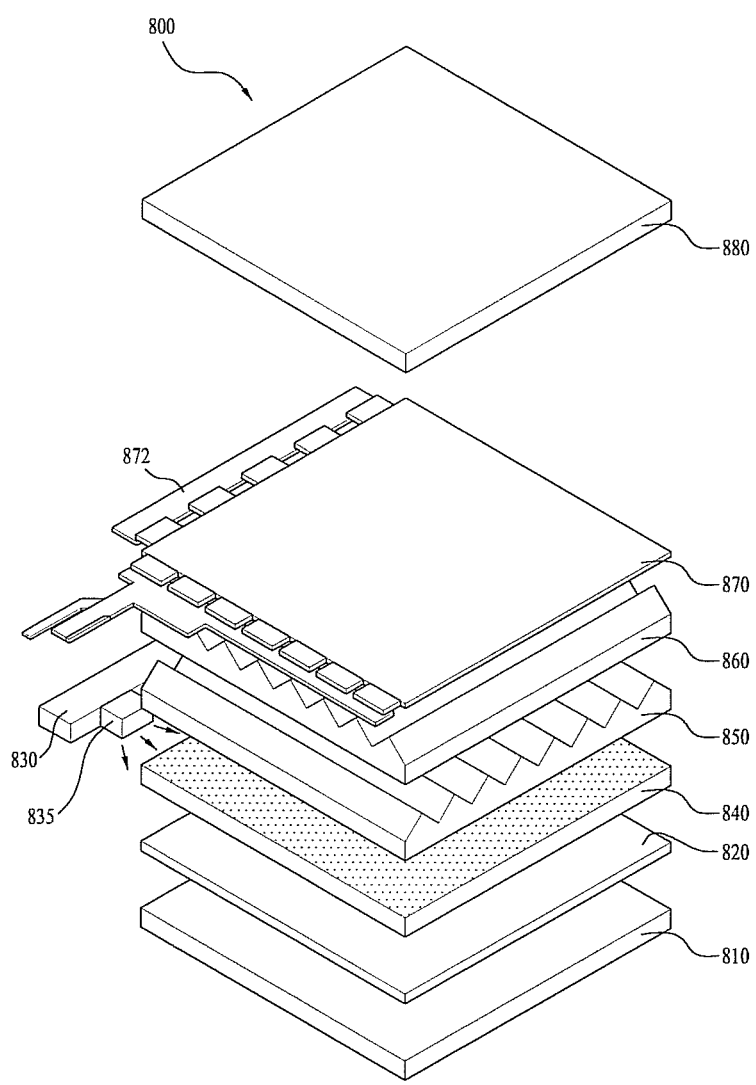
FIG. 31 is a view illustrating a display apparatus including a semiconductor light emitting device package in accordance with an exemplary embodiment of the present invention.

FIG. 31 is a view illustrating a display apparatus including a semiconductor light emitting device package in accordance with an exemplary embodiment of the present invention.

Referring to FIG. 31, the display apparatus according to the illustrated embodiment, which is designated by reference numeral 800, includes a bottom cover 810, a reflective plate 820 provided on the bottom cover 810, a light source module to emit light, a light guide plate 840 disposed in front of the reflective plate 820 to guide light emitted from the light source module to front side of the display apparatus 800, an optical sheet including prism sheets 850 and 860 disposed in front of the light guide plate 840, a display panel 870 disposed in front of the optical sheet 850 and 860, and an image signal output circuit 872 electrically connected with the display panel to supply an image signal, a color filter 880 disposed in front of the display panel 870. Here, the bottom cover 810, reflective plate 820, light source module, light guide plate 840 and optical sheet may constitute a backlight unit.

The light source module includes a substrate 830 and semiconductor light emitting device packages 835 provided on the substrate 830. Here, a printed circuit board (PCB) may be used as the substrate 830. The semiconductor light emitting device package shown in FIG. 1 may be used as the semiconductor light emitting device package 835.

The bottom cover 810 serves to receive the constituent elements of the display apparatus 800. The reflective plate 820 may be provided as a separate element, as shown in FIG. 15, or may be provided as a material having high reflectivity is coated over a rear surface of the light guide plate 840 or a front surface of the bottom cover 810.

Here, the reflective plate 820 may be made of material having high reflectivity and capable of being formed into an ultra thin structure. Polyethylene terephthalate (PET) may be used for the reflective plate 820.

The light guide plate 840 serves to scatter light emitted from the light source module so as to uniformly distribute the light throughout all regions of the display apparatus 800. Therefore, the light guide plate 840 may be made of a material having high refractivity and transmissivity. The material of the light guide plate 840 may include polymethylmethacrylate (PMMA), polycarbonate (PC) or polyethylene (PE).

The first prism sheet 850 may be formed by coating with a polymer exhibiting light transmittance and elasticity over one surface of a base film. The first prism sheet 850 may have a prism layer having a plurality of three-dimensional structures in the form of a repeated pattern. Here, the pattern may be a stripe type in which ridges and valleys are repeated.

The second prism sheet 860 may have a similar structure to the first prism sheet 850. The second prism sheet 860 may be configured such that the orientation direction of ridges and valleys formed on one surface of the base film of the second prism sheet 860 is perpendicular to the orientation direction of the ridges and valleys formed on one surface of the base film of the first prism sheet 850. Such a configuration serves to uniformly distribute light transmitted from the light module and the reflective sheet 820 toward the entire surface of the display panel 870.

Although not shown, a protective sheet may be provided on each of the prism sheets 850 and 860. The provision of the protective sheet may be achieved by forming a protective layer including light-diffusing particles and a binder at each surface of the base film in each of the prism sheets 850 and 860. The prism layer may be made of a polymer selected from the group consisting of polyurethane, styrene-butadiene copolymer, polyacrylate, polymethacrylate, polymethyl methacrylate, polyethyleneterephthalate elastomer, polyisoprene and polysilicon.

Although not shown, a diffusion sheet may be disposed between the light guide plate 840 and the first prism sheet 850. The diffusion sheet is made of a polyester or polycarbonate-based material. The diffusion sheet may maximally increase a light projection angle through refraction and scattering of light incident from the backlight unit. The diffusion sheet may include a support layer including a light diffusing agent, and first and second layers formed on a light emitting surface (in the direction of the first prism sheet) and a light incident surface (in the direction of the reflective sheet) The first and second layers do not include a light diffusing agent.

In the illustrated embodiment, the optical sheet may include a combination of the diffusion sheet, the first prism sheet 850 and the second prism sheet 860. However, the optical sheet may include other combinations, for example, a microlens array, a combination of a diffusion sheet and a microlens array, and a combination of a prism sheet and a microlens array.

A liquid crystal display panel may be used as the display panel 870. Further, instead of the liquid crystal display panel, other kinds of display devices requiring light sources may be provided. The display panel 870 is configured such that a liquid crystal layer is located between glass substrates, and polarizing plates are mounted on both glass substrates so as to utilize polarizing properties of light. Here, the liquid crystal layer has properties between a liquid and a solid. That is, in the liquid crystal layer, liquid crystals which are organic molecules having fluidity like the liquid are regularly oriented, and the liquid crystal layer displays an image using change of such molecular orientation due to an external electric field.

The liquid crystal display panel used in the display apparatus is of an active matrix type, and uses transistors as switches to adjust voltage applied to each pixel. Further, the color filter 880 is provided on the front surface of the display panel 870, and transmits only an R, G or B light component of light projected from the display panel 870 per pixel, thereby displaying an image.

The display apparatus according to this embodiment employs the light source module, which includes the semiconductor light emitting device package according to one of the former embodiments, thereby preventing light interference between the light emitting devices 132 and 134.

As apparent from the above description, a semiconductor light emitting device package in accordance with one embodiment of the present invention prevents discoloration of a body so as to extend the lifespan of the semiconductor light emitting device package, and prevents light interference.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor light emitting device package, comprising:
    a body;
    a first reflective cup and a second reflective cup provided at a top surface of the body and spaced apart from each other;
    a first connection pad provided at the top surface of the body and spaced apart from the first reflective cup and the second reflective cup;
    a second connection pad provided at the top surface of the body and spaced apart from the first reflective cup, the second reflective cup and the first connection pad;
    a first semiconductor light emitting device disposed in the first reflective cup; and a second semiconductor light emitting device disposed in the second reflective cup, wherein each of the first connection pad and the second connection pad includes:
an upper portion exposed from top surface of the body; and
a lead frame connected to the upper portion while extending through a side wall of the body so as to be exposed to an outside of the body, wherein the lead frame includes:
a bent portion bent from the upper portion toward a bottom surface of the body; and
a horizontal portion connected to the bent portion and extending in parallel to the upper portion, and wherein a portion of the horizontal portion is exposed from the side of the body and the bottom surface of the body.

2. The semiconductor light emitting device package according to claim 1, wherein the first reflective cup and the second reflective cup are formed as recesses in the top surface of the body.

3. The semiconductor light emitting device package according to claim 1, wherein the first connection pad and the second connection pad have the same shape and the same size, and the first connection pad and the second connection pad are symmetrically disposed.

4. The semiconductor light emitting device package according to claim 1, wherein a material of the first connection pad and the second connection pad is different from a material of the body.

5. The semiconductor light emitting device package according to claim 4, wherein the body is made of one of polyphthalamide (PPA), silicon (Si), photo-sensitive glass (PSG), sapphire (Al2O3), or a printed circuit board (PCB), and the first connection pad and the second connection pad are made of a metal material.

6. The semiconductor light emitting device package according to claim 1, wherein one of the first connection pad or the second connection pad electrically connects the first semiconductor light emitting device and the second semiconductor light emitting device.

7. The semiconductor light emitting device package according to claim 1, wherein a top surface of each of the first connection pad and the second connection pad is flush with the top surface of the body.

8. The semiconductor light emitting device package according to claim 1, wherein a distance between the first reflective cup and the first connection pad is equal to a distance between the first reflective cup and the second connection pad.

9. The semiconductor light emitting device package according to claim 1, wherein a distance between the first reflective cup and the first connection pad is equal to a distance between the second reflective cup and the first connection pad.

10. The semiconductor light emitting device package according to 1, wherein each of the first connection pad and the second connection pad has a diameter of 0.15 mm or more.

11. The semiconductor light emitting device package according to claim 1, wherein the body includes a cavity having side surfaces and a bottom, and wherein the first reflective cup, the second reflective cup, the first connection pad and the second connection pad are disposed in the bottom of the cavity and are spaced apart from one another.

12. The semiconductor light emitting device package according to claim 11, wherein a center of the first connection pad is aligned with a center of the second connection pad.

13. The semiconductor light emitting device package according to claim 1, wherein the upper portion has a thickness of 200 to 300 μm, and the lead frame has a thickness of 0.2 to 0.3 mm.

14. The semiconductor light emitting device package according to claim 1, wherein the first semiconductor light emitting device includes a first electrode and a second electrode having different polarities, and the second semiconductor light emitting device includes a third electrode and a fourth electrode having different polarities.

15. The semiconductor light emitting device package according to claim 14, further including:
a first wire that connects the first electrode and the first reflective cup;
a second wire that connects the second electrode and the first connection pad;
a third wire that connects the first connection pad and the third electrode; and
a fourth wire that connects the fourth electrode and the second reflective cup.

16. The semiconductor light emitting device package according to claim 14, further including:
a first wire that connects the first electrode and the first reflective cup;
a second wire that connects the second electrode and the second reflective cup;
a third wire that connects the first reflective cup and the third electrode; and
a fourth wire that connects the fourth electrode and the second reflective cup.

17. The semiconductor light emitting device package according to claim 14, further including:
a first wire that connects the first electrode and the first reflective cup;
a second wire that connects the second electrode and the third electrode; and
a third wire that connects the fourth electrode and the second reflective cup.

18. The semiconductor light emitting device package according to claim 1, wherein the first reflective cup and the second reflective cup are point-symmetrical relative to the center of the body.

19. A backlight-unit, comprising:
a bottom cover;
a reflective plate provided on the bottom cover;
a light guide plate disposed in front of the reflective plate;
a light source module emitting light to the light guide plate, wherein the light source module includes a substrate and semiconductor light emitting device packages; and
an optical sheet provided in front of the light guide plate, wherein each of the semiconductor light emitting device packages comprises includes:
a body;
a first reflective cup and a second reflective cup disposed in a top surface of the body and spaced apart from each other;
a first connection pad disposed in the top surface of the body and spaced apart from the first reflective cup and the second reflective cup;
a second connection pad disposed in the top surface of the body and spaced apart from the first reflective cup, the second reflective cup and the first connection pad;
a first semiconductor light emitting device disposed in the first reflective cup; and a second semiconductor light emitting device disposed in the second reflective cup, wherein each of the first connection pad and the second connection pad includes:
    an upper portion exposed from the top surface of the body; and
    a lead frame connected to the upper portion while extending through a side wall of the body as to be exposed to an outside of the body, wherein the lead frame includes:
        a bent portion bent from the upper portion toward a bottom surface of the body; and
        a horizontal portion connected to the bent portion and extending in parallel to the upper portion, and wherein portion of the horizontal portion is exposed from the side of the body and the bottom surface of the body.

20. A display apparatus, comprising:
a display panel;
a backlight that emits light to the display panel; and
an image signal output circuit connected with the display panel to supply an image signal, wherein the backlight includes:
a bottom cover;
a reflective plate provided on the bottom cover;
a light guide plate disposed in front of the reflective plate;
a light source module that emits, light to the light guide plate, wherein the light source module includes a substrate and semiconductor light emitting device packages; and
an optical sheet provided in front of the light guide plate, wherein each of the semiconductor light emitting device packages includes:
a body;
a first reflective cup and a second reflective cup disposed in a top surface of the body and spaced apart from each other;
a first connection pad disposed in the top surface of the body and spaced apart from the first reflective cup and the second reflective cup;
a second connection pad disposed in the top surface of the body and spaced apart from the first reflective cup, the second reflective cup and the first connection pad;
a first semiconductor light emitting device disposed in the first reflective cup; and
a second semiconductor light emitting device disposed in the second reflective cup, wherein each of the first connection pad and the second connection pad includes:
    an upper portion exposed from the top surface of the body; and
    a lead frame connected to the upper portion while extending through a side wall of the body so as to be exposed to an outside of the body, wherein the lead frame includes:
        a bent portion bent from the upper portion toward a bottom surface of the body; and
        a horizontal portion connected to the bent portion and extending in parallel to the upper portion, and wherein a portion of the horizontal portion is exposed from the side of the body and the bottom surface of the body.

\* \* \* \* \*